United States Patent
Toriumi et al.

(10) Patent No.: US 10,109,710 B2
(45) Date of Patent: Oct. 23, 2018

(54) SEMICONDUCTOR DEVICE HAVING GERMANIUM LAYER AS CHANNEL REGION AND METHOD FOR MANUFACTURING THE SAME

(71) Applicant: JAPAN SCIENCE AND TECHNOLOGY AGENCY, Kawaguchi-shi, Saitama (JP)

(72) Inventors: Akira Toriumi, Tokyo (JP); Choong-hyun Lee, Tokyo (JP); Tomonori Nishimura, Tokyo (JP)

(73) Assignee: Japan Science and Technology Agency, Kawaguchi-shi, Saitama (JP)

( * ) Notice: Subject to any disclaimer, the term of this patent is extended or adjusted under 35 U.S.C. 154(b) by 0 days.

(21) Appl. No.: 15/523,603

(22) PCT Filed: Nov. 2, 2015

(86) PCT No.: PCT/JP2015/080954
§ 371 (c)(1),
(2) Date: May 1, 2017

(87) PCT Pub. No.: WO2016/072398
PCT Pub. Date: May 12, 2016

(65) Prior Publication Data
US 2017/0317170 A1     Nov. 2, 2017

(30) Foreign Application Priority Data
Nov. 5, 2014   (JP) .................................. 2014-225622

(51) Int. Cl.
*H01L 29/66*     (2006.01)
*H01L 29/08*     (2006.01)
(Continued)

(52) U.S. Cl.
CPC ........ *H01L 29/0847* (2013.01); *H01L 21/223* (2013.01); *H01L 29/105* (2013.01);
(Continued)

(58) Field of Classification Search
None
See application file for complete search history.

(56) References Cited

U.S. PATENT DOCUMENTS

| | | |
|---|---|---|
| 4,371,403 A | 2/1983 | Ikubo |
| 4,885,618 A | 12/1989 | Schubert |

(Continued)

FOREIGN PATENT DOCUMENTS

| | | |
|---|---|---|
| JP | S56-93367 A | 7/1981 |
| JP | H03-42872 A | 2/1991 |

(Continued)

OTHER PUBLICATIONS

C. H. Lee et al., "Reconsideration of Electron Mobility in Ge n-MOSFETs from Ge Substrate Side," The Institute of Electronics, Information and Communication Engineers (IEICE) Technical Report, SDM2013-136, pp. 5-8, Jan. 29, 2014.

(Continued)

*Primary Examiner* — Telly Green
(74) *Attorney, Agent, or Firm* — Amster, Rothstein & Ebenstein LLP

(57) ABSTRACT

A semiconductor device having a channel region that is formed in a germanium layer and has a first conductive type, and a source region and a drain region that are formed in the germanium layer and have a second conductive type different from the first conductive type, wherein an oxygen concentration in the channel region is less than an oxygen concentration in a junction interface between at least one of the source region and the drain region and a region that (Continued)

surrounds the at least one of the source region and the drain region and has the first conductive type.

12 Claims, 20 Drawing Sheets

(51) Int. Cl.
*H01L 29/167* (2006.01)
*H01L 29/10* (2006.01)
*H01L 21/223* (2006.01)
*H01L 29/04* (2006.01)
*H01L 29/78* (2006.01)

(52) U.S. Cl.
CPC ...... *H01L 29/167* (2013.01); *H01L 29/66477* (2013.01); *H01L 29/045* (2013.01); *H01L 29/78* (2013.01)

(56) References Cited

U.S. PATENT DOCUMENTS

| | | | |
|---|---|---|---|
| 5,220,191 | A | 6/1993 | Matsushita |
| 5,463,237 | A | 10/1995 | Funaki |
| 5,580,799 | A | 12/1996 | Funaki |
| 5,874,772 | A | 2/1999 | Tsujino |
| 9,691,620 | B2 * | 6/2017 | Toriumi ............ H01L 21/28255 |
| 2002/0068406 | A1 | 6/2002 | Ishii |
| 2004/0058490 | A1 | 3/2004 | Ishii |
| 2006/0292872 | A1 | 12/2006 | Haukka et al. |
| 2007/0218603 | A1 | 9/2007 | Dyer et al. |
| 2010/0148259 | A1 | 6/2010 | Dyer et al. |
| 2015/0228492 | A1 * | 8/2015 | Toriumi ............ H01L 21/02175 257/411 |
| 2016/0276445 | A1 | 9/2016 | Toriumi et al. |

FOREIGN PATENT DOCUMENTS

| | | | |
|---|---|---|---|
| JP | H04-355959 A | 12/1992 | |
| JP | H09-306904 A | 11/1997 | |
| JP | 2003-017579 A | 1/2003 | |
| JP | 2007-251163 A | 9/2007 | |
| JP | 2010-103296 A | 5/2010 | |
| JP | WO 2014030389 A1 * | 2/2014 | ....... H01L 21/02175 |
| JP | 5581464 B2 | 7/2014 | |
| KR | 1019950004606 A | 2/1995 | |
| WO | 2014/030389 A1 | 2/2014 | |
| WO | 2014/050187 A1 | 4/2014 | |
| WO | 2015/064338 A1 | 5/2015 | |

OTHER PUBLICATIONS

Kimihiko Kato et al., "Effect of Reducing Character of Gate Metals on Pr Valence State in Pr Oxide Film on Ge Substrate", The Institute of Electronics, Information and Communication Engineers (IEICE) Technical Report, SDM2012-50, pp. 37-42, May 21, 2012.

Intellectual Property Office Ministry of Economic Affairs, "Official Letter", issued in Taiwanese Patent Application No. 104136329, which is a Taiwanese counterpart of U.S. Appl. No. 15/523,603, dated Aug. 4, 2016, 11 pages (5 pages of Translation of Official Letter and 6 pages of Official Letter).

Intellectual Property Office Ministry of Economic Affairs, "Office Action", issued in Taiwanese Patent Application No. 104136329, which is a Taiwanese counterpart of U.S. Appl. No. 15/523,603, dated Oct. 30, 2017, 13 pages (6 pages of Translation of Office Action and 7 pages of Office Action).

Korean Intellectual Property Office, "Office Action", issued in Korean Patent Application No. 10-2017-7011179, which is a Korean counterpart of U.S. Appl. No. 15/523603, dated Feb. 18, 2018, 8 pages (4 pages of Translation of Office Action and 4 pages of Office Action).

* cited by examiner

SEMICONDUCTOR DEVICE HAVING GERMANIUM LAYER AS CHANNEL REGION AND METHOD FOR MANUFACTURING THE SAME

CROSS-REFERENCE TO RELATED APPLICATIONS

The present application claims the benefit of and priority to Japanese Patent Application No. 2014-225622, filed on Nov. 5, 2014 and International Patent Application No. PCT/JP2015/080954, filed on Nov. 2, 2015, the entire contents of which are incorporated by reference herein.

TECHNICAL FIELD

The present invention relates to a semiconductor device and a method for manufacturing the same, particularly to a semiconductor device having a germanium layer as a channel region and a method for manufacturing the same.

BACKGROUND ART

Germanium (Ge) is a semiconductor having better electronic properties than silicon (Si). For example, there have been developed Metal Oxide Semiconductor Field Effect Transistors (MOSFETs) using a germanium layer as a channel region. Patent Document 1 describes that a germanium layer is heat treated in a reducing gas atmosphere or inert gas atmosphere.

PRIOR ART DOCUMENT

Patent Document

Patent Document 1: International Publication No. 2014/050187

SUMMARY OF THE INVENTION

Problem to be Solved by the Invention

In the MOSFET, the on-state current can be increased by, for example, increasing the channel mobility. In addition, the off-state current can be reduced by, for example, reducing junction currents in the source region and the drain region. However, it is difficult to increase the on-state current while reducing the off-state current. Therefore, it is difficult to increase the ratio of on-state current to off-state current (so-called the ON/OFF ratio).

The present invention has been made in view of the above problems, and aims to provide a semiconductor device that can increase the ratio of on-state current to off-state current and a method for manufacturing the same.

Means for Solving the Problem

The present invention is a semiconductor device characterized by including: a channel region that is formed in a germanium layer and has a first conductive type; and a source region and a drain region that are formed in the germanium layer and have a second conductive type different from the first conductive type, wherein an oxygen concentration in the channel region is less than an oxygen concentration in a junction interface between at least one of the source region and the drain region and a region that surrounds the at least one of the source region and the drain region and has the first conductive type.

In the above configuration, the oxygen concentration in the channel region can be configured to be $1 \times 10^{16}$ cm$^{-3}$ or less, and the oxygen concentration in the junction interface can be configured to be greater than $1 \times 10^{16}$ cm$^{-3}$.

In the above configuration, the oxygen concentration in the channel region can be configured to be $5 \times 10^{15}$ cm$^{-3}$ or less.

In the above configuration, the first conductive type can be configured to be p-type, and the second conductive type can be configured to be n-type.

The present invention is a method for manufacturing a semiconductor device, the method characterized by including: forming a channel region that is formed in a germanium layer and has a first conductive type; forming a source region and a drain region in the germanium layer, the source region and the drain region having a second conductive type different from the first conductive type; and setting an oxygen concentration so that an oxygen concentration in the channel region is less than an oxygen concentration in a junction interface between at least one of the source region and the drain region and a region that surrounds the at least one of the source region and the drain region and has the first conductive type.

In the above configuration, the setting of the oxygen concentration can be configured to include heat treating the germanium layer in a reducing atmosphere while a region to be the channel region in the germanium layer is exposed and a surface of the germanium layer on a region to be the junction interface is not exposed.

In the above configuration, the heat treating can be configured to include heat treating a germanium layer of which oxygen concentrations in the channel region and the junction interface are $1 \times 10^{16}$ cm$^{-3}$ or greater.

In the above configuration, the method can be configured to further include introducing oxygen into the region to be the channel region and the region to be the junction interface before the heat treating.

In the above configuration, the setting of the oxygen concentration can be configured to include selectively introducing oxygen into a region to be the junction interface while not introducing oxygen into a region to be the channel region.

In the above configuration, the setting of the oxygen concentration can be configured to include setting the oxygen concentration so that the oxygen concentration in the channel region becomes $1 \times 10^{16}$ cm$^{-3}$ or less and the oxygen concentration in the junction interface becomes greater than $1 \times 10^{16}$ cm$^{-3}$.

Effects of the Invention

The present invention can provide a semiconductor device that can increase the ratio of on-state current to off-state current.

MODES FOR CARRYING OUT THE EMBODIMENTS

Hereinafter, a description will be given of the experiments that led the inventors to the present invention.

Figure 1A:
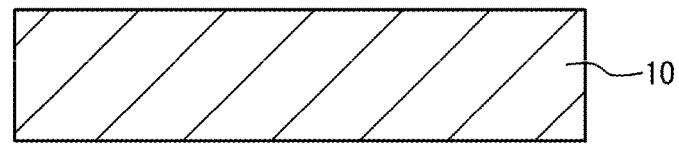
FIG. 1A through FIG. 1D are cross-sectional views illustrating a method for fabricating a MOS structure used for experiments.

A substrate A and a substrate B grown by different growth methods were used as a single-crystal germanium substrate to fabricate a MOS structure. Substrate A was a germanium substrate with oxygen concentration of $1\times10^{16}$ cm$^{-3}$ or less as described later with respect to FIG. 8 and FIG. 10, and substrate B was a germanium substrate with oxygen concentration greater than $1\times10^{16}$ cm$^{-3}$ as described later with respect to FIG. 4. FIG. 1A through FIG. 1D are cross-sectional views illustrating a method for fabricating the MOS structure used for the experiments. As illustrated in FIG. 1A, a single-crystal germanium substrate 10 having the (111) plane as a principal plane is prepared. When the germanium substrate 10 is p-type, the acceptor concentration NA is $2\times10^{16}$ cm$^{-3}$. When the germanium substrate 10 is n-type, the donor concentration ND is $1\times10^{16}$ cm$^{-3}$.

Figure 1B:
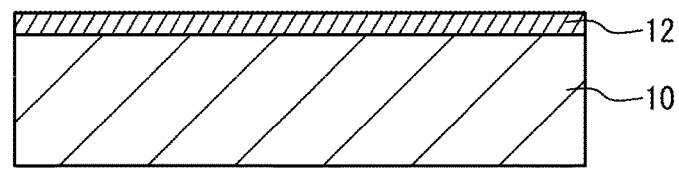
Figure 1C:
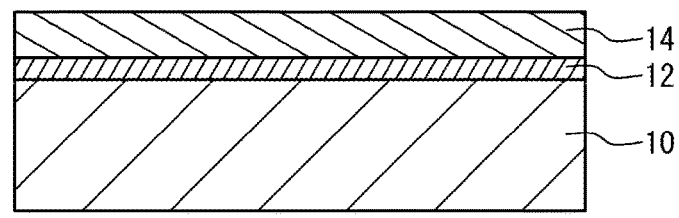

As illustrated in FIG. 1B, a germanium oxide film 12 is formed on the germanium substrate 10. The germanium oxide film 12 is formed by heat treating the germanium substrate 10 in an oxygen gas atmosphere. The germanium oxide film 12 is formed at an oxygen pressure of 70 atmospheres, at a substrate temperature of 500° C. The germanium oxide film 12 has a film thickness of approximately 5 to 6 nm. As illustrated in FIG. 1C, a metal film as a gate electrode 14 is formed on the surface of the germanium oxide film 12. The gate electrode 14 is formed of a gold (Au) film. The above-described process completes the sample for measuring the mobility.

For the fabricated sample, the number of carriers and the mobility $\mu_{eff}$ at room temperature were measured by a split CV method. The split CV method is a method in which the number of carriers is calculated from an integration of the CV measurements, and the mobility is calculated from the number of carriers and the I-V measurement. A surface carrier density $N_S$ is calculated from the number of carriers.

Figure 1D:
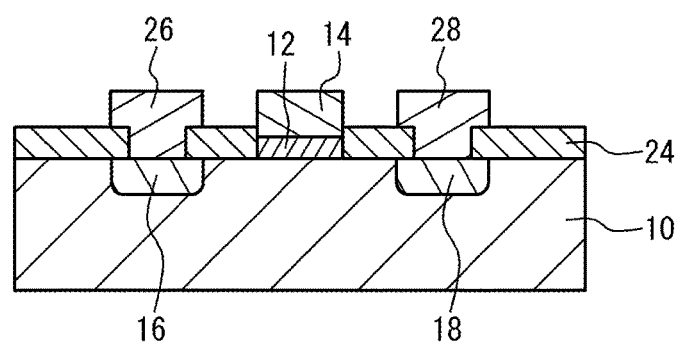

When an FET is fabricated, as illustrated in FIG. 1D, a source region 16 and a drain region 18 are formed in the germanium substrate 10. The source region 16 and the drain region 18 were formed by an ion implantation method. In n-FETs, the germanium substrate 10 is p-type, and the source region 16 and the drain region 18 are n-type. In p-FETs, the germanium substrate 10 is n-type, and the source region 16 and the drain region 18 are p-type. Thereafter, as an activation annealing, the germanium substrate 10 is heat treated in a nitrogen gas atmosphere. The source region 16 and the drain region 18 have a conductive type different from those of regions surrounding the source region 16 and the drain region 18, and thus, a pn junction is formed.

In the n-FET, phosphorus (P) is ion-implanted to form the source region 16 and the drain region 18. Phosphorus (P) is ion-implanted at an implantation energy of 50 keV and in an implantation dose amount of $1\times10^{15}$ cm$^{-2}$. In the p-FET, boron (B) is ion-implanted to form the source region 16 and the drain region 18. Boron (B) is ion-implanted at an implantation energy of 20 keV and in an implantation dose amount of $1\times10^{15}$ cm$^{-2}$.

On the germanium substrate 10, formed is the germanium oxide film 12 as a gate insulating film as in FIG. 1B. The gate electrode 14 is formed on the germanium oxide film 12. The gate electrode 14 is formed of an aluminum (Al) film. An insulating film 24 is formed on the germanium substrate 10. The insulating film 24 is formed of an yttrium oxide film and a silicon oxide film stacked in this order from the germanium substrate 10 side. Apertures are formed in the insulating film 24 on the source region 16 and the drain region 18. A source electrode 26 is formed so as to make contact with the source region 16 through the aperture, and a drain electrode 28 is formed so as to make contact with the drain region 18 through the aperture. The source electrode 26 and the drain electrode 28 are formed of an aluminum film.

For the fabricated FET sample, measured were a source current $I_S$ and a drain current $I_D$ with respect to a gate voltage $V_G$ at room temperature.

Figure 2:
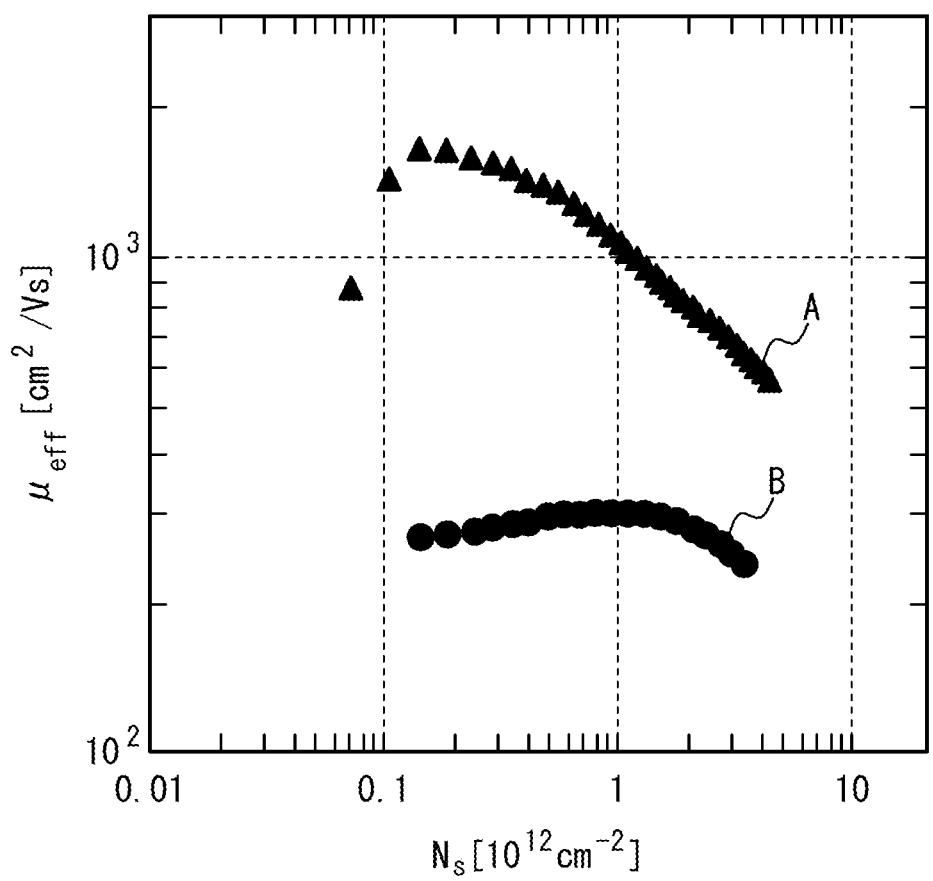
FIG. 2 is a graph of electron mobility $\mu_{eff}$ versus surface electron density $N_S$ in substrates A and B.

FIG. 2 is a graph of electron mobility $\mu_{eff}$ versus surface electron density $N_S$ in the substrates A and B. As illustrated in FIG. 2, the electron mobility $\mu_{eff}$ of the substrate A reaches a maximum at around $0.2\times10^{12}$ cm$^{-2}$ of $N_S$, and is approximately 1700 cm$^2$/Vs. The electron mobility $\mu_{eff}$ of the substrate B reaches a maximum at around $1\times10^{12}$ cm$^{-2}$ of $N_S$, and is approximately 300 cm$^2$/Vs. The mobility $\mu_{eff}$ of the substrate A is higher than the mobility $\mu_{eff}$ of the substrate B at all $N_S$. The reason why the mobility differs between the substrates A and B as described above is not known.

Figure 3A:
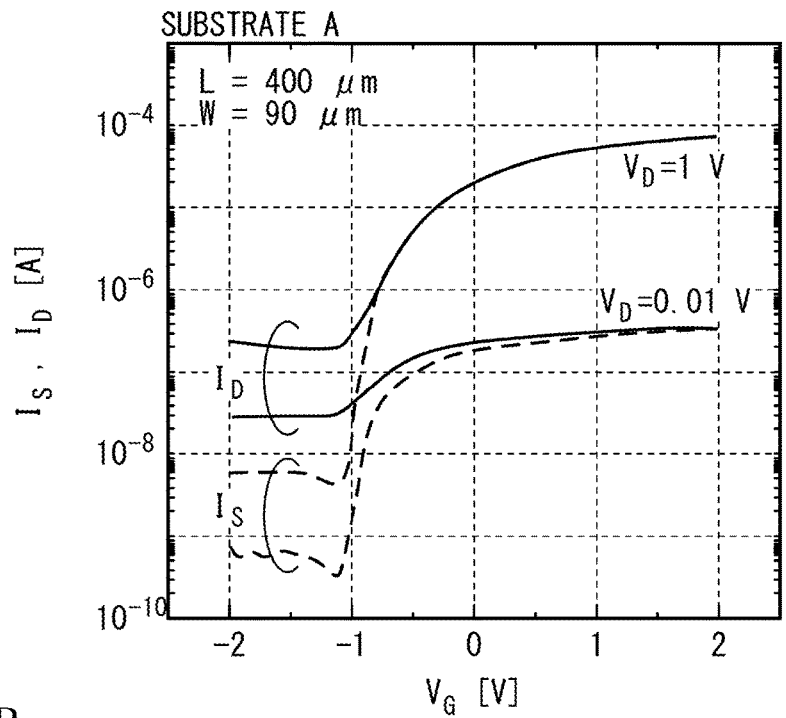
FIG. 3A and FIG. 3B are graphs of source current $I_S$ and drain current $I_D$ versus gate voltage $V_G$ of an n-FET in the substrates A and B, respectively.
Figure 3B:
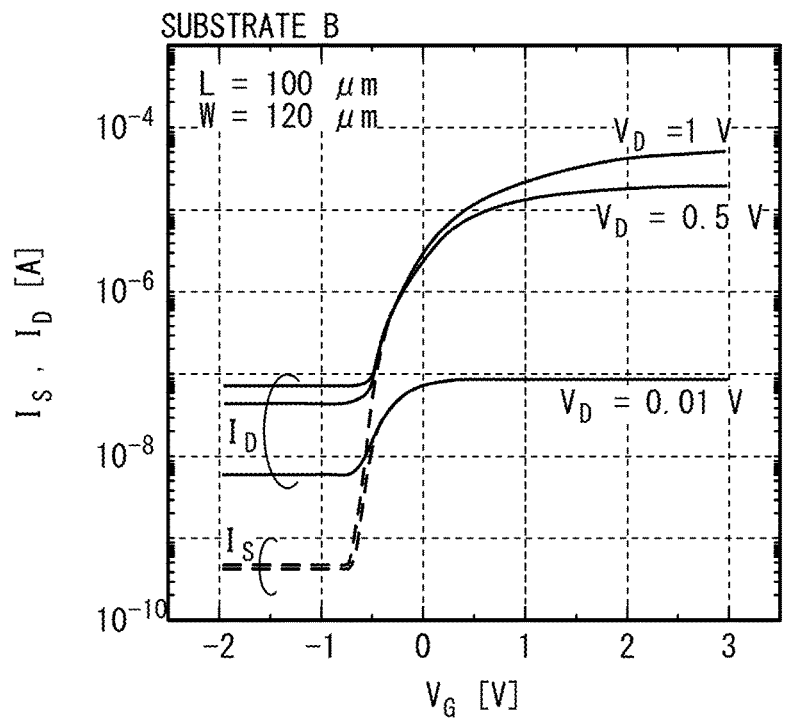

FIG. 3A and FIG. 3B are graphs of source current $I_S$ and drain current $I_D$ versus gate voltage $V_G$ of an n-FET in the substrates A and B, respectively. The n-FET fabricated with the substrate A has a gate length L of 400 μm and a gate width W of 90 μm, while the n-FET fabricated with the substrate B has a gate length L of 100 μm and a gate width W of 120 μm. The source region 16 and the drain region 18 have dimensions of 130×100 μm². An activation annealing was performed at a temperature of 500° C. for 10 minutes.

As illustrated in FIG. 3A and FIG. 3B, a pinch-off voltage is approximately −1 V both in the substrates A and B. The source current $I_S$ and the drain current $I_D$ in the region where the gate voltage $V_G$ is positive correspond to the on-state current. The source current $I_S$ and the drain current $I_D$ in the region where the gate voltage $V_G$ is −1 V or less correspond to the off-state current. The FET with larger on-state current and smaller off-state current has better performance.

The on-state current in the substrate A is greater than the on-state current in the substrate B. This is because the mobility in the substrate A is higher than the mobility in the substrate B as illustrated in FIG. 2. On the other hand, the off-state current in the substrate B is less than the off-state current in the substrate A. This is considered because a leakage current in a pn junction in the substrate B is less than that in the substrate A. With regard to the on-state current, the substrate A is more desirable, while with regard to the off-state current, the substrate B is more desirable. If the on-state current approximately equal to that in the substrate A and the off-state current approximately equal to that in the substrate B can be achieved, the FET characteristics improve. The inventors investigated the reason that the on-state current and the off-state current differ between the substrates A and B.

Figure 4:
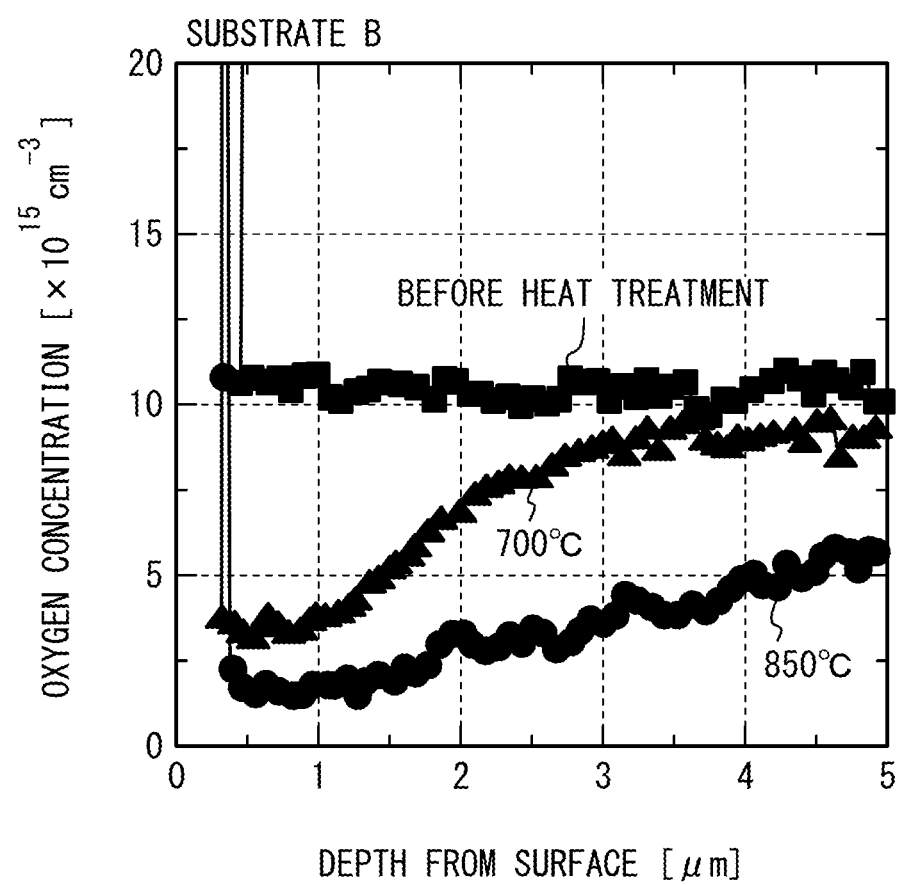
FIG. 4 is a graph of oxygen concentration versus depth in the substrate B.

The substrates A and B were subjected to a Secondary Ion Mass Spectrometry (SIMS) analysis. FIG. 4 is a graph of oxygen concentration versus depth in the substrate B. After FIG. 1A and before FIG. 1B, a heat treatment in a hydrogen gas (100%) atmosphere at an atmospheric pressure was performed while the surface of the substrate B was exposed. The heat treatment temperature was 700° C. and 850° C., and the heat treatment time was 15 minutes. In FIG. 4, the black squares indicate the results of the SIMS analysis before the substrate B was subjected to the hydrogen heat treatment, the black triangles indicate the results of the SIMS analysis after the hydrogen heat treatment at 700° C., and the black circles indicate the results of the SIMS analysis after the hydrogen heat treatment at 850° C. The detection limit for oxygen is approximately $1\times10^{15}$ cm$^{-3}$. The oxygen concentration is extremely high in the region where the depth is less than about 0.3 to 0.4 μm. This is because oxygen adsorbed on the surface of the germanium substrate was observed.

As illustrated in FIG. 4, in the substrate B before the hydrogen heat treatment, the oxygen concentration is $1\times10^{16}$ cm$^{-3}$ or greater at least until the depth from the surface reaches 5 μm. On the other hand, the oxygen concentration in the substrate A is equal to or less than the detection limit. As seen above, the substrate B has a higher oxygen concentration than the substrate A. From this fact, it was estimated that the low mobility and the low junction leakage current in the substrate B somehow correlate with the oxygen concentration in the germanium substrate 10.

When the substrate B is hydrogen heat treated at 700° C., the oxygen concentration in the substrate B decreases to $1\times10^{16}$ cm$^{-3}$ or less. At a depth of 1.5 μm or less, the oxygen concentration is approximately $5\times10^{15}$ cm$^{-3}$ or less, and at a depth of 1 μm or less, the oxygen concentration is approximately $3\times10^{15}$ to $4\times10^{15}$ cm$^{-3}$. When the substrate B is heat treated at 850° C., the oxygen concentration further decreases. At a depth of 4 μm or less, the oxygen concentration is approximately $5\times10^{15}$ cm$^{-3}$ or less. At a depth of 1.5 μm or less, the oxygen concentration is approximately $2\times10^{15}$ cm$^{-3}$. As described above, as the temperature of the hydrogen heat treatment is increased, the oxygen concentration in the substrate 10 decreases.

For the substrate B, samples subjected to a hydrogen heat treatment at various heat treatment temperatures were fabricated to measure the mobility. The fabrication processes of the sample are the same as those illustrated in FIG. 1A through FIG. 1C except that a heat treatment in a hydrogen atmosphere for 15 minutes was performed before the process of FIG. 1B.

Figure 5A:
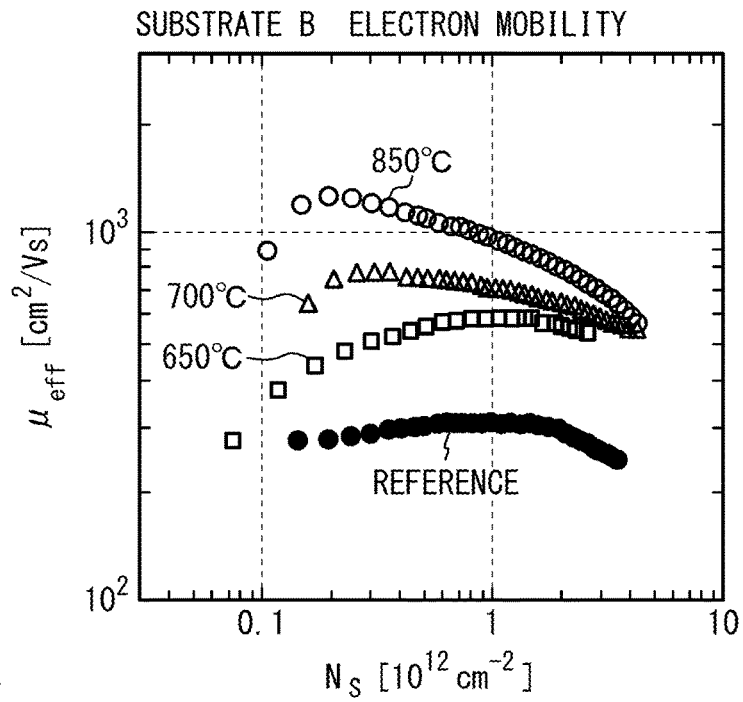
FIG. 5A and FIG. 5B are graphs of mobility $\mu_{eff}$ versus surface density $N_S$ of samples of which the substrate B was subjected to a hydrogen heat treatment.
Figure 5B:
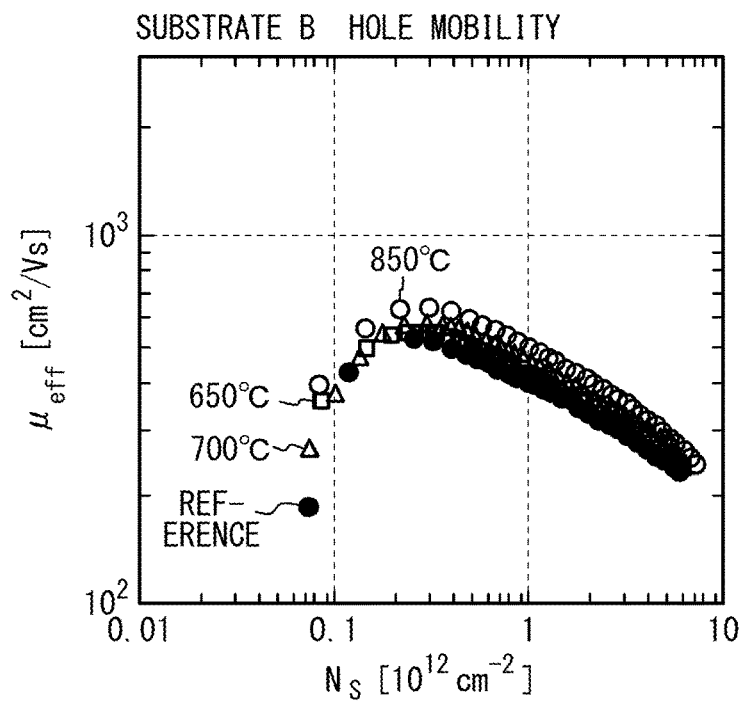

FIG. 5A and FIG. 5B are graphs of mobility $\mu_{eff}$ versus surface density $N_S$ of samples of which the substrate B was subjected to the hydrogen heat treatment. The substrate B of FIG. 5A is p-type, the surface density $N_S$ represents a surface electron density, and the mobility $\mu_{eff}$ represents an electron mobility. The substrate B of FIG. 5B is n-type, the surface density $N_S$ represents a surface hole density, and the mobility $\mu_{eff}$ represents a hole mobility. The hydrogen heat treatment temperature is 650° C. (open squares), 700° C. (open triangles), and 850° C. (open circles), and the heat treatment time is 15 minutes. The reference sample (black circles) was not heat treated, the film thickness of the germanium oxide film is 15 nm, and the film formation temperature of the germanium oxide film is higher than those of other samples.

As illustrated in FIG. 5A, in the reference sample, the largest electron mobility $\mu_{eff}$ is approximately 300 cm²/Vs. When the heat treatment temperature is set to 650° C., the largest mobility $\mu_{eff}$ improves to approximately 600 cm²/Vs. When the heat treatment temperature is set to 700° C., the largest mobility $\mu_{eff}$ further improves to approximately 800 cm²/Vs. When the heat treatment temperature is set to 850° C., the largest mobility $\mu_{eff}$ becomes approximately 1200 cm²/Vs, which is approximately the same as that of the substrate A.

As illustrated in FIG. 5B, in each sample, the largest hole mobility $\mu_{eff}$ is 500 to 700 cm²/Vs. As the heat treatment temperature increases, the largest hole mobility increases. The improvement of the hole mobility by the hydrogen heat treatment is not as noticeable as that of the electron mobility.

For the substrate B, FET samples subjected to a hydrogen heat treatment at various heat treatment temperatures were fabricated. The fabrication processes of the sample are the same as those illustrated in FIG. 1A through FIG. 1D except that a heat treatment in a hydrogen atmosphere for 15 minutes was performed before the process of FIG. 1B. The fabricated FET has a gate length L of 200 μm and a gate width W of 90 μm. The source region 16 and the drain region 18 have dimensions of 130×100 μm².

Figure 6A:
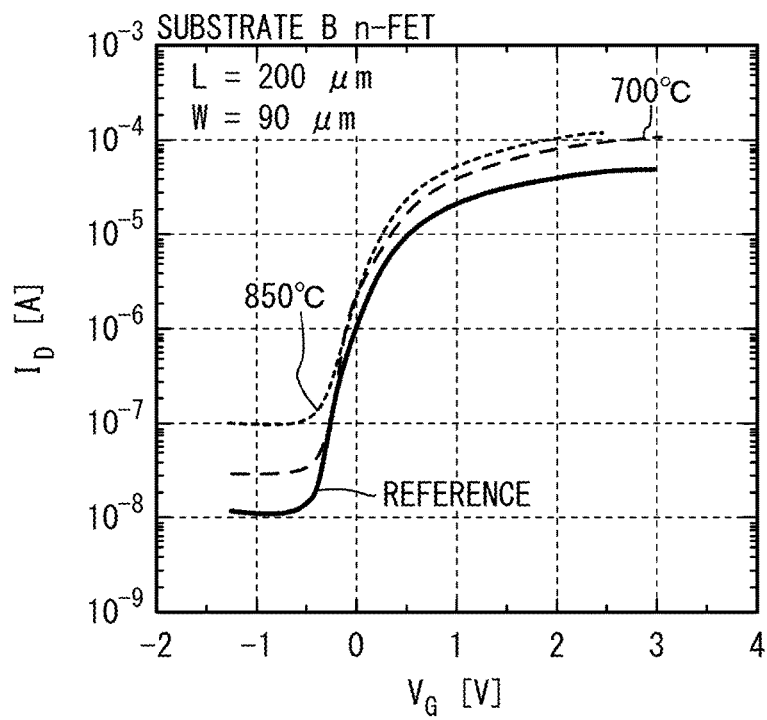
FIG. 6A and FIG. 6B are graphs of drain current $I_D$ versus gate voltage $V_G$ of samples of which the substrate B was subjected to a hydrogen heat treatment.
Figure 6B:
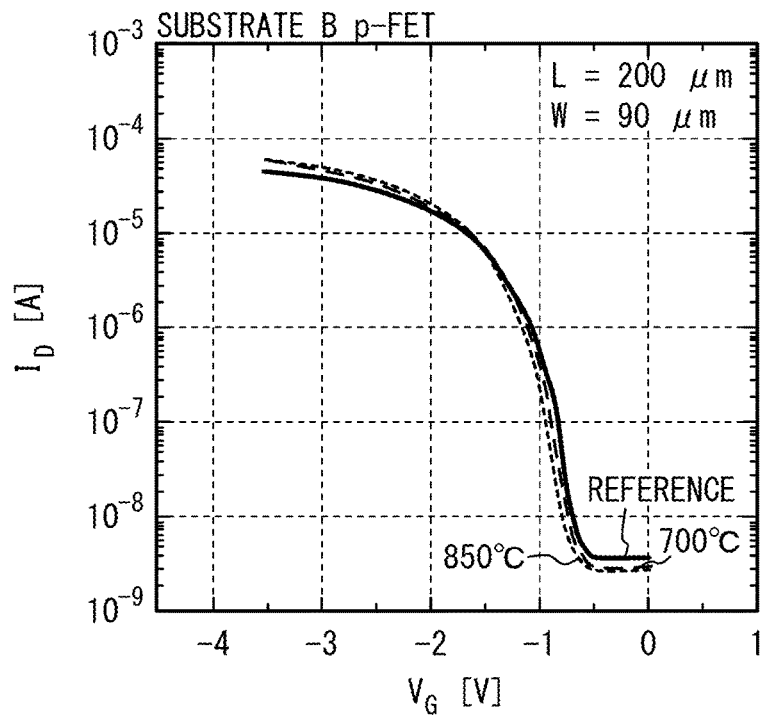

FIG. 6A and FIG. 6B are graphs of drain current $I_D$ versus gate voltage $V_G$ of samples of which the substrate B was subjected to a hydrogen heat treatment. FIG. 6A presents an n-FET, and FIG. 6B presents a p-FET. The drain voltage $V_D$ is 0.5V. As illustrated in FIG. 6A, in the n-FET, when the hydrogen heat treatment was performed, the on-state current ($I_D$ at around 2V of $V_G$) becomes greater than that of the reference sample. However, the off-state current ($I_D$ at around −1V of $V_G$) also becomes greater. As described above, the hydrogen heat treatment causes the FET characteristics to become the same as those of the substrate A illustrated in FIG. 3B. As illustrated in FIG. 6B, in the p-FET, the change in FET characteristics due to the hydrogen heat treatment is hardly observed.

As described above, the hydrogen heat treatment increases the on-state current and the off-state current. This is considered because the hydrogen heat treatment improved the mobility and increased the junction leakage current. The hydrogen heat treatment affects the n-FET more than the p-FET.

The comparison between FIG. 4 and FIG. 5A and FIG. 5B demonstrates that as the temperature of the hydrogen heat treatment increases, the oxygen concentration in the substrate B decreases, and the electron mobility and the hole mobility improve. When the temperature of the hydrogen heat treatment is 850° C., the oxygen concentration in the substrate B becomes approximately $2 \times 10^{15}$ cm$^{-3}$, and the electron mobility becomes the same as that of the substrate A illustrated in FIG. 2. This suggests that the oxygen concentration in the germanium substrate 10 correlates with the mobility. There is a correlation especially between the oxygen concentration and the electron mobility. To improve the mobility, the heat treatment temperature is preferably 750° C. or greater, more preferably 800° C. or greater, further preferably 850° C. or greater. Since the melting point of germanium is approximately 938° C., the heat treatment temperature is preferably 925° C. or less, more preferably 900° C. or less.

The comparison between FIG. 4 and FIG. 6A and FIG. 6B demonstrates that as the temperature of the hydrogen heat treatment increases and the oxygen concentration in the substrate B decreases, the on-state current and the off-state current increase. When the temperature of the hydrogen heat treatment is 850° C., the on-state current and the off-state current become the same as those of the substrate A illustrated in FIG. 3A. The reason why the on-state current increases is because the mobility improved, and the reason why the off-state current increases is because the junction leakage current increases. This suggests that there is a correlation between the oxygen concentration in the germanium substrate 10 and the on-state current and the off-state current. There is a correlation especially between the oxygen concentration and the characteristics of the n-FET.

In the substrate B, it is not known why the oxygen concentration decreases as the heat treatment temperature of the hydrogen heat treatment is increased, but it may be considered that oxygen in the germanium substrate 10 is removed by a reducing gas, for example.

To confirm that the oxygen concentration in the germanium substrate is decreased by the hydrogen heat treatment, oxygen ions were ion-implanted to the germanium substrate 10 of the substrate A, and a heat treatment was then performed. Fabricated were a sample of which the heat treatment atmosphere was a nitrogen gas atmosphere and a sample of which the heat treatment atmosphere was a hydrogen gas atmosphere. The fabrication processes are the same as those illustrated in FIG. 1A through FIG. 1C except the ion-implantation and the heat treatment. In the state of FIG. 1A, oxygen ions were implanted into the germanium substrate 10 at an implantation energy of 100 keV and in an implantation dose amount of $1 \times 10^{13}$ cm$^{-2}$. Then, to repair the damage by the ion implantation, a heat treatment in a nitrogen atmosphere at 750° C. was performed using a silicon oxide film as a cap. Then, the cap was removed, and a heat treatment in a nitrogen gas atmosphere or hydrogen gas atmosphere was performed while the surface of the germanium substrate 10 was exposed. The heat treatment temperature in the heat treatment is 700° C., and the heat treatment time is 15 minutes. Then, the processes of FIG. 1B and FIG. 1C were performed.

Figure 7:
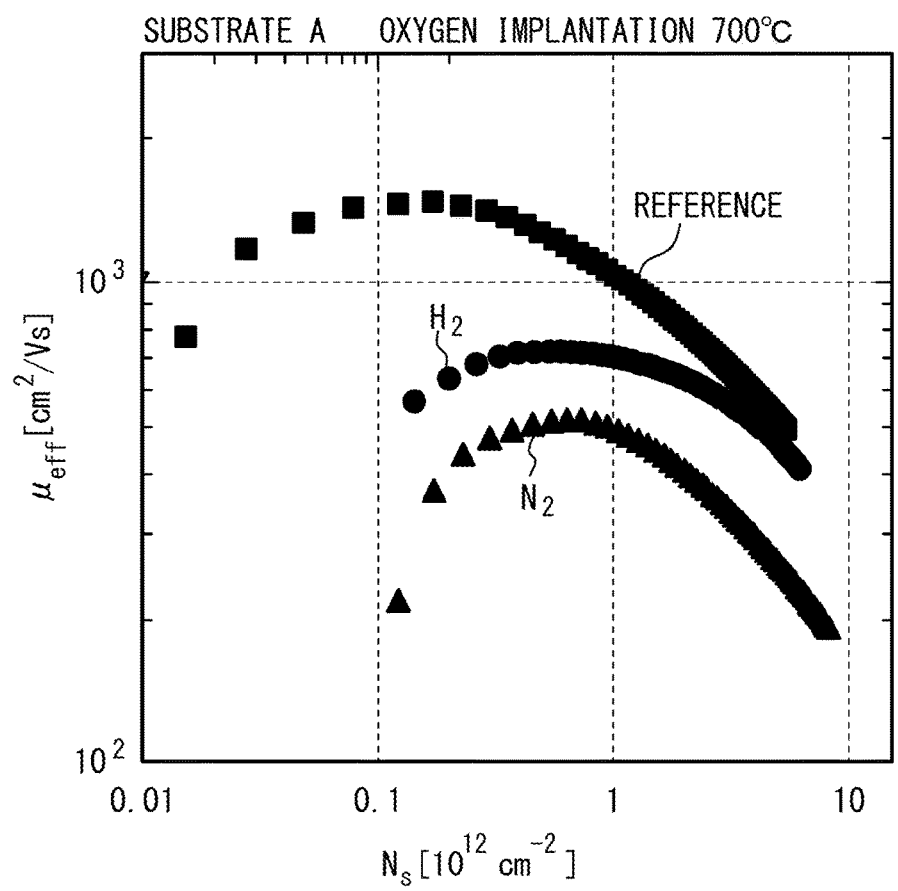
FIG. 7 is a graph of electron mobility $\mu_{eff}$ versus surface electron density $N_S$ of samples in which oxygen ions were ion-implanted into the substrate A.

FIG. 7 is a graph of electron mobility $\mu_{\textit{eff}}$ versus surface electron density $N_S$ of samples in which oxygen ions were ion-implemented into the substrate A. In the reference sample, oxygen was not ion-implanted, and the heat treatment was not performed. As illustrated in FIG. 7, in the reference sample, the largest mobility is approximately 1200 cm$^2$/Vs. In the sample subjected to a heat treatment in a nitrogen gas atmosphere after oxygen ion implantation, the largest mobility is approximately 500 cm$^2$/Vs. In contrast, in the sample subjected to a heat treatment in a hydrogen gas atmosphere after oxygen ion implantation, the largest mobility is approximately 800 cm$^2$/Vs. As described above, when oxygen ions are implanted, the mobility decreases. A nitrogen heat treatment after oxygen ion implantation poorly improves the mobility, but a hydrogen heat treatment improves the mobility.

Figure 8:
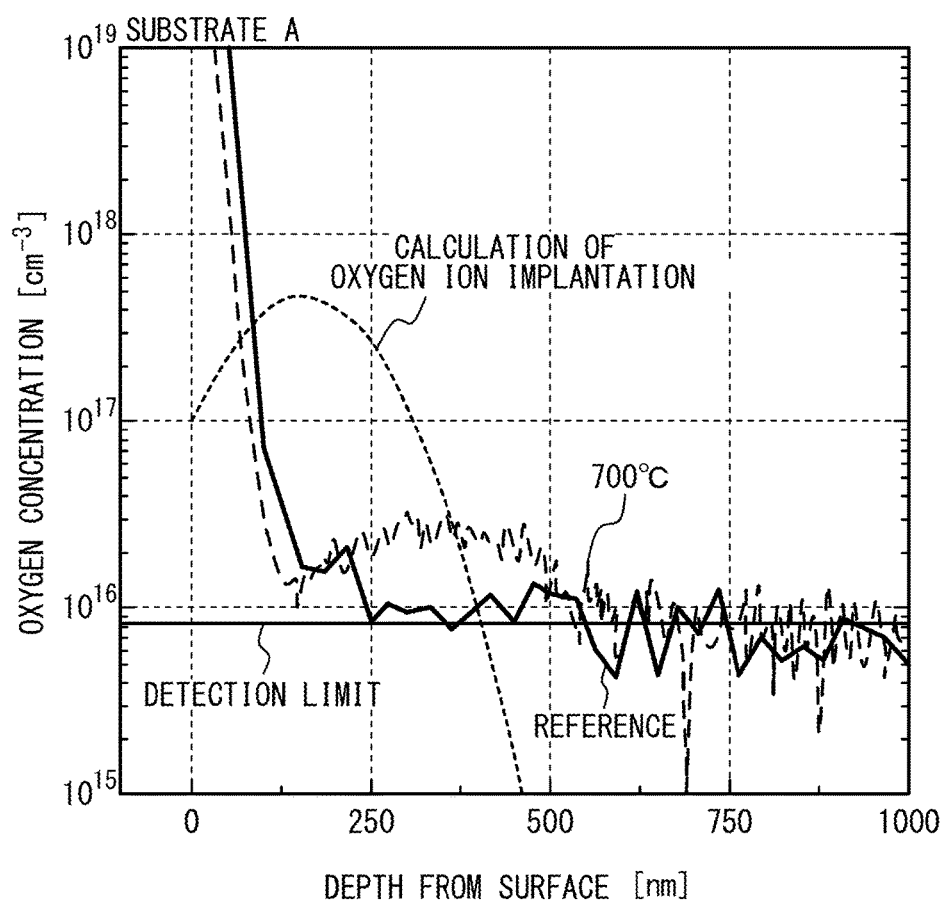
FIG. 8 is a graph of oxygen concentration versus depth from the surface of samples in which oxygen ions were ion-implemented into the substrate A.

Samples which were subjected to a hydrogen heat treatment at 700° C. were subjected to the SIMS analysis. FIG. 8 is a graph of oxygen concentration versus depth from the surface in samples in which oxygen ions were ion-implemented into the substrate A. The solid line indicates the results of the SIMS analysis of the reference sample before the hydrogen heat treatment, the dashed line indicates the results of the SIMS analysis of the sample after the hydrogen heat treatment at 700° C., and the dotted line indicates the calculation result of oxygen ions which were ion-implanted. In the region where the depth is less than 150 nm, observed is oxygen adsorbed on the surface of the germanium substrate. Since the measuring speeds differ, the detection limit and the behavior in the region where the depth is shallow differ from those in FIG. 4.

As illustrated in FIG. 8, in the reference sample, the oxygen concentration in the substrate A before oxygen ions were implanted is approximately $8 \times 10^{15}$ cm$^{-3}$, which is the detection limit. Oxygen ions are ion-implanted into the germanium substrate 10 so that the oxygen concentration reaches a peak of $5 \times 10^{17}$ cm$^{-3}$ at the depth of approximately 150 nm as presented in the calculation result indicated by the dotted line.

Because of the hydrogen heat treatment at 700° C., the oxygen concentration is up to $3 \times 10^{16}$ cm$^{-3}$ at the depth of 150 to 600 nm. At the depth of 600 nm or greater, the oxygen concentration is the detection limit. FIG. 8 reveals that the oxygen concentration in the germanium substrate 10 is decreased by hydrogen heat treating the germanium substrate 10 into which oxygen was implanted. As illustrated in FIG. 7, the mobility increases through the hydrogen heat treatment more than through the nitrogen heat treatment. Thus, it is considered that the hydrogen heat treatment removes oxygen in the substrate 10 and improves the mobility.

As seen from the experiment results presented in FIG. 4 through FIG. 8, when the substrate B is heat treated in a reducing gas atmosphere, at approximately 700° C. or greater, oxygen in the substrate B is removed, and the oxygen concentration thus decreases. The decrease in oxygen concentration in the substrate B makes the mobility of the substrate B approximately equal to the mobility of the substrate A as illustrated in FIG. 5A. As illustrated in FIG. 6A, the on-state current and off-state current in the substrate B become approximately equal to those in the substrate A. Thus, it is considered that the oxygen concentration in the substrate correlates with the difference in mobility and junction leakage current between the substrates A and B.

To examine the relation between the oxygen concentration in the germanium substrate and the junction leakage current, a pn junction was formed in the substrate A into which oxygen ions were implanted to evaluate the junction current and the FET characteristics.

Figure 9A:
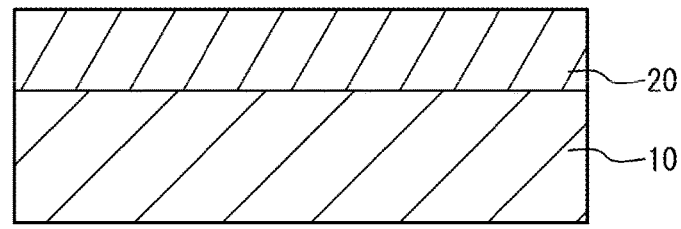
FIG. 9A through FIG. 9D are cross-sectional views illustrating a method for fabricating a sample for evaluating the junction current.
Figure 9B:
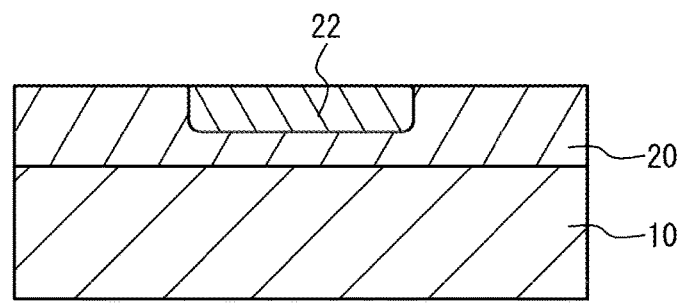
Figure 9C:
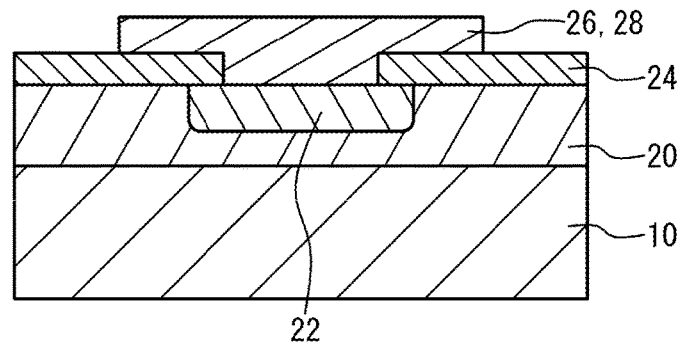

FIG. 9A through FIG. 9C are cross-sectional views illustrating a method for fabricating samples used to evaluate the junction current. As illustrated in FIG. 9A, oxygen ions are implanted into the p-type single-crystal germanium substrate 10 having the (111) plane as a principal plane to form an oxygen-ion-implanted region 20. Oxygen ions are implanted at an implantation energy of 100 keV and in an implantation dose amount of $1\times10^{13}$ cm$^{-3}$. After the implantation of oxygen ions, to repair the damage, a silicon oxide film is formed as a cap, and a heat treatment in a nitrogen gas atmosphere at 750° C. is performed. This process forms the oxygen-ion-implanted region 20 with a depth of approximately 300 nm.

As illustrated in FIG. 9B, an n-type region 22 is formed in the oxygen-ion-implanted region 20. The n-type region 22 is formed by ion-implantation of phosphorus ions. Phosphorus ions are ion-implanted at an implantation energy of 30 keV and in an implantation dose amount of $1\times10^{13}$ cm$^{-2}$ or $1\times10^{14}$ cm$^{2}$. After the ion implantation, as an activation annealing, a heat treatment in a nitrogen gas atmosphere at 600° C. for 30 seconds is performed. This process forms the n-type region 22 with a depth of approximately 50 nm. The n-type region 22 has dimensions of 80×80 μm$^2$.

As illustrated in FIG. 9C, the insulating film 24 is formed on the oxygen-ion-implanted region 20 in the germanium substrate 10. The insulating film 24 is formed of an yttrium oxide film and a silicon oxide film stacked in this order from the substrate 10 side. An aperture is formed in the insulating film 24 on the n-type region 22. Formed are the source electrode 26 and the drain electrode 28 that make contact with the n-type region 22 through the aperture. The source electrode 26 and the drain electrode 28 are formed of an aluminum film.

Figure 9D:
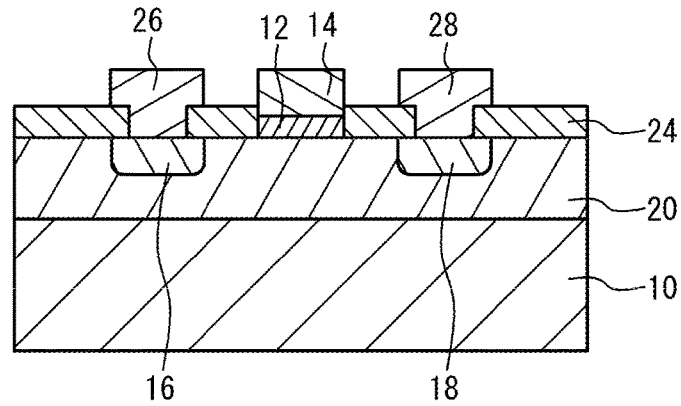

FIG. 9D is a cross-sectional view of a sample used to evaluate the FET characteristics. As illustrated in FIG. 9D, the oxygen-ion-implanted region 20 is formed in the germanium substrate 10 as in FIG. 9A. The n-type region 22 of FIG. 9C is formed as the source region 16 and the drain region 18. Other structures are the same as those of FIG. 1D, and the description thereof is thus omitted.

Figure 10:
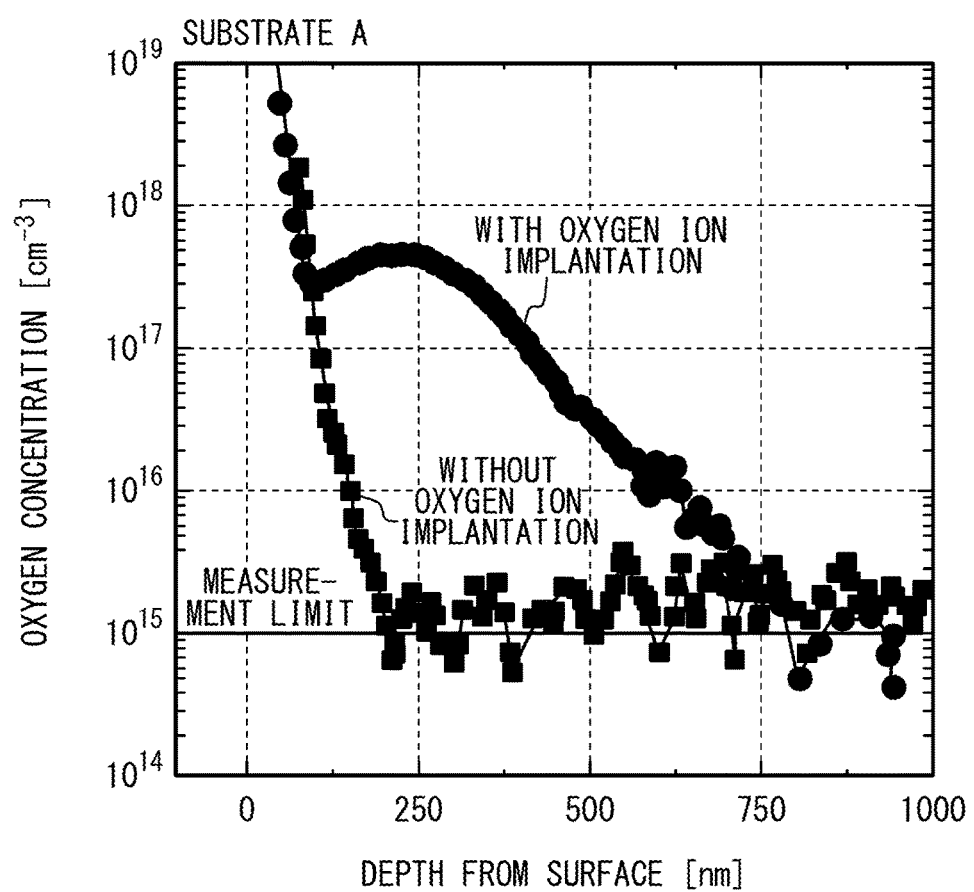
FIG. 10 is a graph of oxygen concentration versus depth from the surface of a sample in which oxygen ions were implanted into the substrate A and a sample in which oxygen ions were not implanted into the substrate A.

A sample in which oxygen was ion-implanted into the substrate A in a dose amount of $1\times10^{13}$ cm$^{-3}$ and a sample in which oxygen was not implanted were subjected to the SIMS analysis. FIG. 10 is a graph of oxygen concentration versus depth from the surface in the sample in which oxygen was ion-implanted into the substrate A and in the sample in which oxygen was not implanted. As illustrated in FIG. 10, the oxygen concentration in the sample in which oxygen was not implanted is approximately equal to the measurement limit ($1\times10^{15}$ cm$^{-3}$). In the sample in which oxygen was implanted, the oxygen concentration at a depth of approximately 250 nm is approximately $5\times10^{17}$ cm$^{-3}$.

Figure 11A:
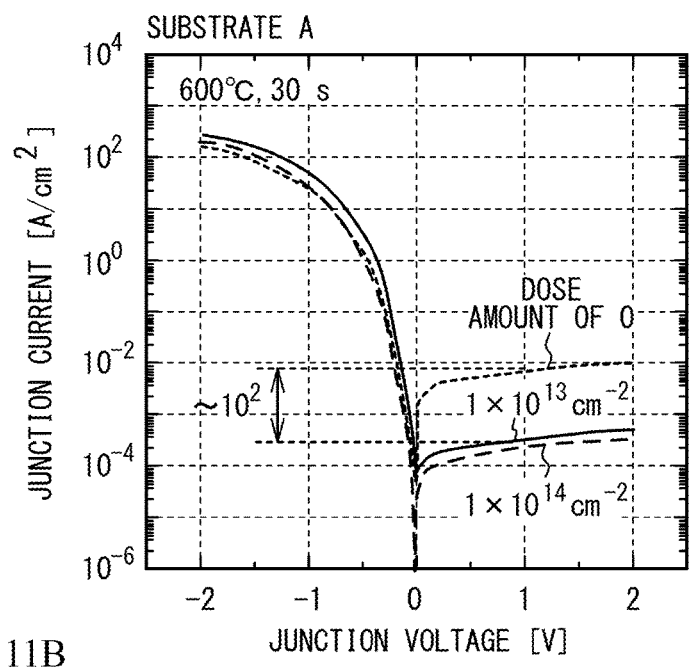
FIG. 11A is a graph of junction current versus junction voltage of FETs using the substrate A.
Figure 11B:
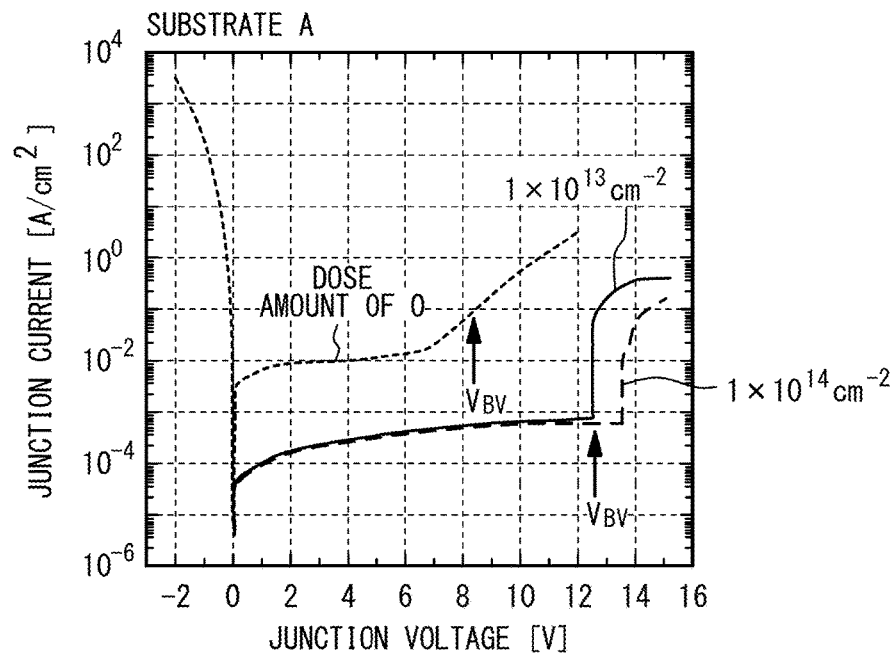
FIG. 11B illustrates reverse current.

FIG. 11A is a graph of junction current versus junction voltage of FETs using the substrate A, and FIG. 11B illustrates reverse current. Presented are measurement results of the junction current of a sample in which oxygen was not ion-implanted (the sample with a dose amount of 0), a sample with an oxygen dose amount of $1\times10^{13}$ cm$^{-2}$, and a sample with an oxygen dose amount of $1\times10^{14}$ cm$^{-2}$. As illustrated in FIG. 11A, the reverse junction current in the sample in which oxygen was implanted was two orders of magnitude less than the reverse junction current in the sample in which oxygen was not implanted. As illustrated in FIG. 11B, the reverse breakdown voltage $V_{BV}$ in the sample in which oxygen was implanted is greater than that in the sample in which oxygen was not implanted.

Figure 12:
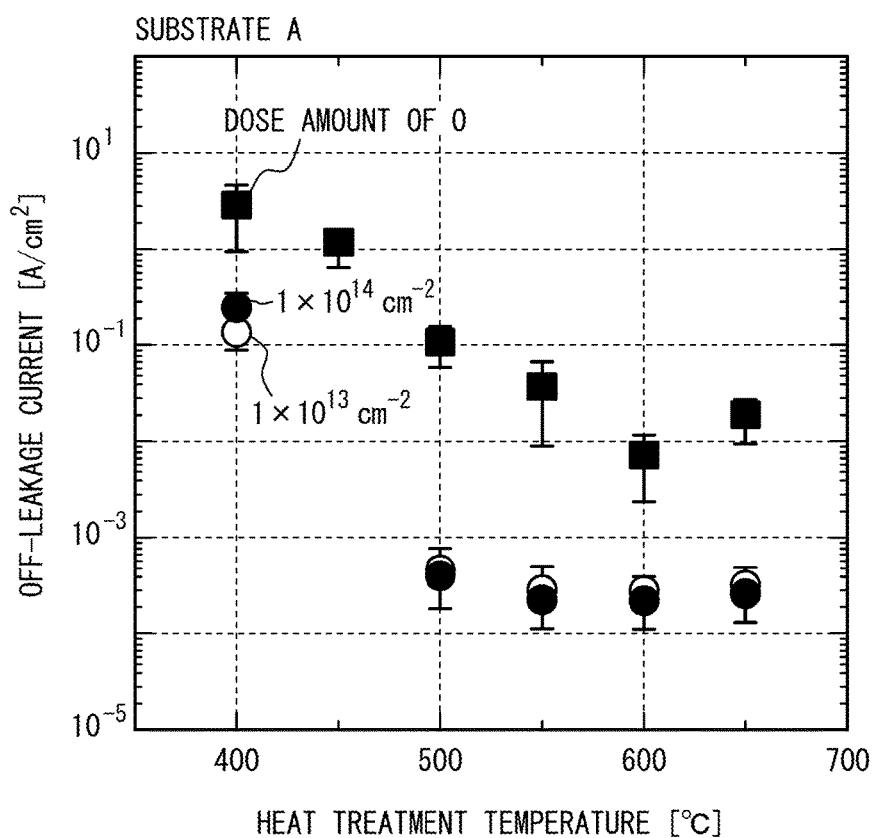
FIG. 12 is a graph of off-leakage current of FETs using the substrate A versus heat treatment temperature.

FIG. 12 is a graph of off-leakage current of FETs using the substrate A versus heat treatment temperature. The heat treatment temperature is the heat treatment temperature for activation annealing after the implantation of phosphorus in FIG. 9B. The off-leakage current is a drain current at a gate voltage of −1 V in an FET sample. As presented in FIG. 12, the reverse off-leakage current in the sample in which oxygen was implanted is approximately two orders of magnitude less than that in the sample in which oxygen was not implanted.

As described above, the junction current in the sample in which oxygen was ion-implanted is two orders of magnitude less than that in the sample in which oxygen was not ion-implanted, the breakdown voltage in the sample in which oxygen was ion-implanted is greater than that in the sample in which oxygen was not ion-implanted, and the off-leakage current in the sample in which oxygen was ion-implanted is two orders of magnitude less than that in the sample in which oxygen was not ion-implanted.

Figure 13:
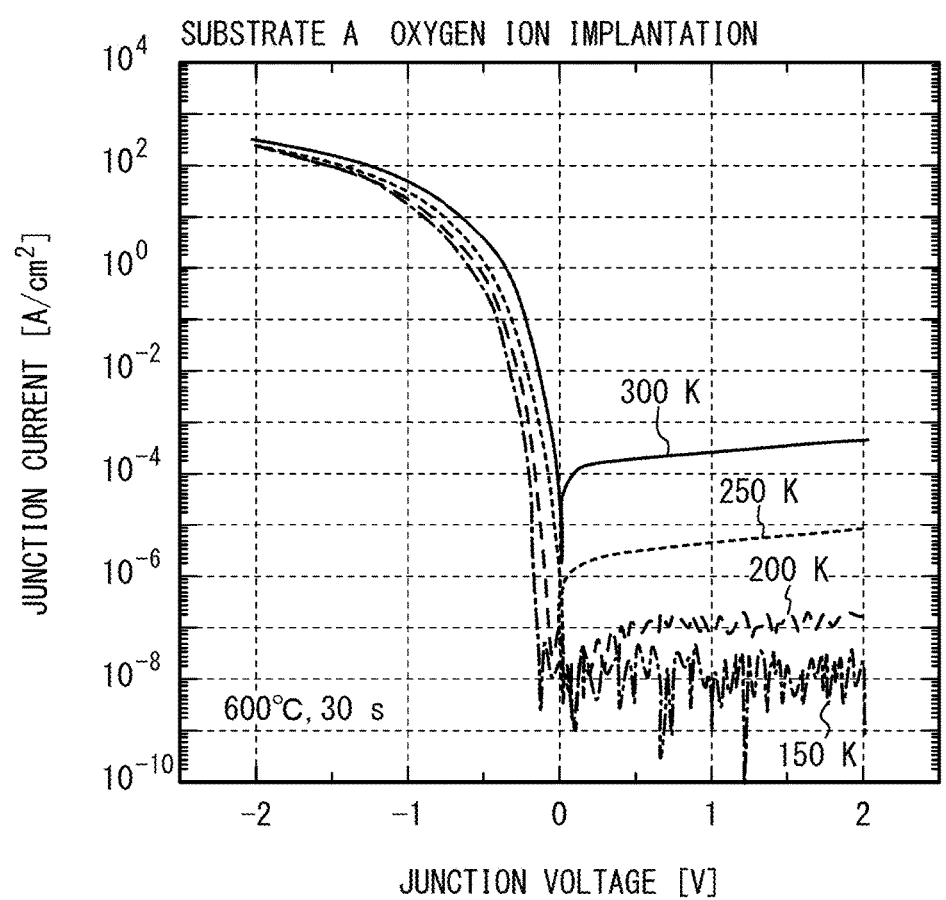
FIG. 13 illustrates temperature dependence of the junction current of FETs using the substrate A into which oxygen ions were implanted.

FIG. 13 illustrates temperature dependence of the junction current of FETs using the substrate A into which oxygen ions were implanted. The measured sample is a sample with an oxygen dose amount of $1\times10^{15}$ cm$^{-2}$. An activation annealing was performed at 600° C. for 30 seconds. The measured temperature was set to 300 K, 250 K, 200 K, and 150 K, and the junction current was measured. As illustrated in FIG. 13, as the temperature decreases, the reverse junction current decreases enough to change the number of digits. This indicates that the reverse junction current is not simply due to a tunnel current.

It is considered that when defect is introduced into a semiconductor, a tunnel current through the defect is generated and a reverse junction leakage current increases. However, as illustrated in FIG. 11A and FIG. 11B, it has been revealed that as defect correlated with oxygen in the germanium substrate 10 increases, such a leakage current decreases. Accordingly, the reverse breakdown voltage increases. In addition, the off-state current decreases. This reason is unclear. FIG. 13 demonstrates that the reverse junction current is not a tunnel current and has an activation energy.

Based on the above described experiment results, a description will be given of embodiments of which the on-state current is large and the off-state current is small.

First Embodiment

Figure 14:
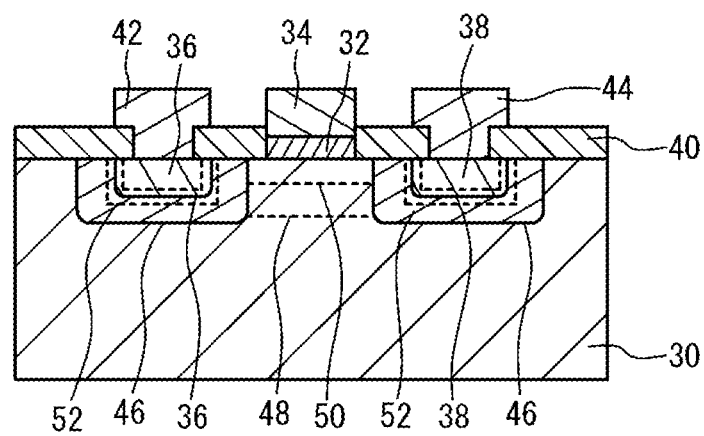
FIG. 14 is a cross-sectional view of a semiconductor device in accordance with a first embodiment.

FIG. 14 is a cross-sectional view of a semiconductor device in accordance with a first embodiment. As illustrated in FIG. 14, a source region 36 and a drain region 38 are formed in a germanium layer 30. A gate insulating film 32 is formed on the germanium layer 30 between the source region 36 and the drain region 38. A gate electrode 34 is formed on the gate insulating film 32. An insulating film 40 is formed on the germanium layer 30 other than the gate electrode 34. Apertures are formed in the insulating film 40 on the source region 36 and the drain region 38. A source electrode 42 is formed so as to make contact with the source region 36 through the aperture, and a drain electrode 44 is formed so as to make contact with the drain region 38 through the aperture.

The gate electrode 34 and a channel region 50 in the germanium layer 30 under the gate insulating film 32 have a conductive type different from the conductive type of the source region 36 and the drain region 38. The source region 36 and the germanium layer 30 form a pn junction, and the drain region 38 and the germanium layer 30 form a pn junction. A low oxygen concentration region 48 in which the oxygen concentration is low is formed in the channel region. In pn junction interfaces 52, formed are high oxygen concentration regions 46 in which the oxygen concentration is greater than the oxygen concentration in the low oxygen concentration region 48.

The germanium layer 30 may be a single-crystal germanium substrate, a single-crystal or poly crystal germanium film formed on a substrate (e.g., a silicon substrate). The germanium layer 30 is made of, for example, n-type or p-type germanium. Furthermore, the germanium layer 30 may contain silicon to the extent that the above-described effect of the experiments can be obtained. The composition ratio of silicon is required to be approximately 10% or less of the total. The principal plane of the germanium layer 30 may be any plane, and may be, for example, the (100) plane, the (111) plane, or the (110) plane. The (100) plane, the (111) plane, and the (110) plane include crystal planes equivalent to these planes. In addition, the principal plane may be off from these planes by several degrees. That is, the normal direction of the principal plane may be tilted from the <111> direction and the <110> direction by several degrees, preferably one degree or less.

The gate insulating film 32 may be a germanium oxide film, a high-permittivity insulating film, or a multilayered film of a germanium oxide film and a high-permittivity insulating film. The high-permittivity insulating film may be a rare-earth metal oxide film made of hafnium oxide, zirconium oxide, or yttrium oxide. The gate insulating film 32 preferably has a film thickness of 2 nm or less, more preferably 1.5 nm or less, further preferably 1.0 nm or less. The gate electrode 34 may be formed of a conductive layer made of a metal or a semiconductor. The germanium oxide film may contain a substance such as yttrium oxide or scandium oxide that has an oxygen potential less than that of germanium oxide. The substance with an oxygen potential less than that of germanium oxide may be germanium nitride or aluminum oxide. Furthermore, the germanium oxide film may contain an oxidized material of at least one of an alkaline-earth element, a rare-earth element, and aluminum. This configuration can provide the good interface between the germanium layer 30 and the gate insulating film 32. In addition, the gate insulating film 32 can be thinned. For example, the Equivalent Oxide Thickness (EOT) can be made to be 1 nm or less.

In the n-FET, the germanium layer 30 is p-type, and the source region 36 and the drain region 38 are n-type. In the p-FET, the germanium layer 30 is n-type, and the source region 36 and the drain region 38 are p-type. In the n-FET, the use of the germanium layer 30 having the (111) plane as a principal plane can improve the performance. In the p-FET, the use of the germanium layer 30 having the (100) plane or the (110) plane as a principal plane can improve the performance.

The insulating film 40 is a film that protects the surface of the germanium layer 30. The insulating film 40 may be a film containing, for example, a silicon oxide film or a silicon nitride film. The source electrode 42 and the drain electrode 44 are electrodes that are in ohmic contact with the source region 36 and the drain region 38, respectively. The source electrode 42 and the drain electrode 44 may be formed of, for example, a metal film made of aluminum or the like.

In the first embodiment, the channel region 50 having a first conductive type is formed in the germanium layer 30. The source region 36 and the drain region 38 having a second conductive type (different from the first conductive type) are formed in the germanium layer 30. The oxygen concentration in the channel region 50 is less than the oxygen concentrations in the junction interfaces 52 between the source region 36 and the drain region 38 and the regions surrounding the source region 36 and the drain region 38 in the germanium layer 30. Since the oxygen concentration in the channel region 50 is low, the mobility in the channel region 50 can be improved. Accordingly, the on-state current can be increased. Since the oxygen concentration in the junction interface 52 is high, the junction leakage current can be reduced. Accordingly, the off-state current can be decreased. Thus, the ratio of on-state current to off-state current can be increased. Therefore, the FET characteristics can be improved.

The high oxygen concentration region 46 is only required to include the junction interface 52, and may include the entire of the source region 36 and the drain region 38. The oxygen concentration in the channel region is only required to be less than the oxygen concentration in the junction interface of at least one of the source region 36 and the drain region 38.

As illustrated in FIG. 4, to make the on-state current large, the oxygen concentration in the channel region 50 is preferably $1 \times 10^{16}$ cm$^{-3}$ or less, more preferably $5 \times 10^{15}$ cm$^{-3}$ or less, further preferably $3 \times 10^{15}$ cm$^{-3}$ or less.

To reduce the off-state current, the oxygen concentration in the junction interface 52 is preferably greater than $1 \times 10^{16}$ cm$^{-3}$, more preferably $2 \times 10^{16}$ cm$^{-3}$ or greater, further preferably $5 \times 10^{16}$ cm$^{-3}$ or greater.

As illustrated in FIG. 6A and FIG. 6B, to improve the FET characteristics, the first conductive type is preferably p-type and the second conductive type is preferably n-type.

Second Embodiment

Figure 15A:
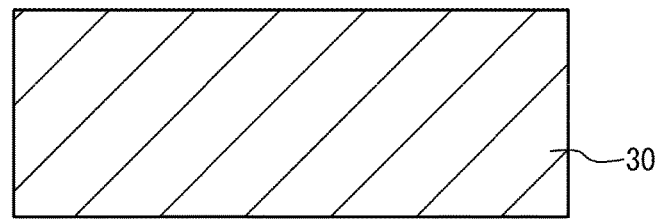
FIG. 15A through FIG. 15D are cross-sectional views illustrating a method for manufacturing an FET in accordance with a second embodiment.
Figure 15B:
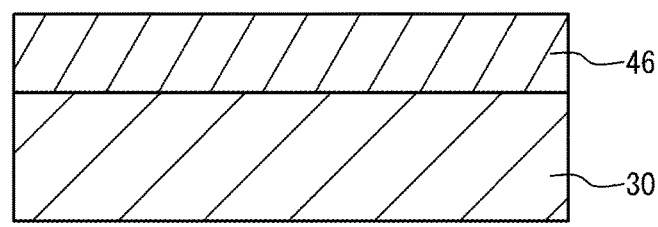

FIG. 15A through FIG. 15D are cross-sectional views illustrating a method for manufacturing an FET in accordance with a second embodiment. As illustrated in FIG. 15A, the germanium layer 30 is prepared. The germanium layer 30 has an oxygen concentration of $1 \times 10^{16}$ cm$^{-3}$ or less as, for example, the germanium layer 30 of the substrate A has. As illustrated in FIG. 15B, oxygen is introduced into the vicinity of the surface of the germanium layer 30 to form the high oxygen concentration region 46. The high oxygen concentration region 46 is formed by, for example, ion-implantation of oxygen ions.

Figure 15C:
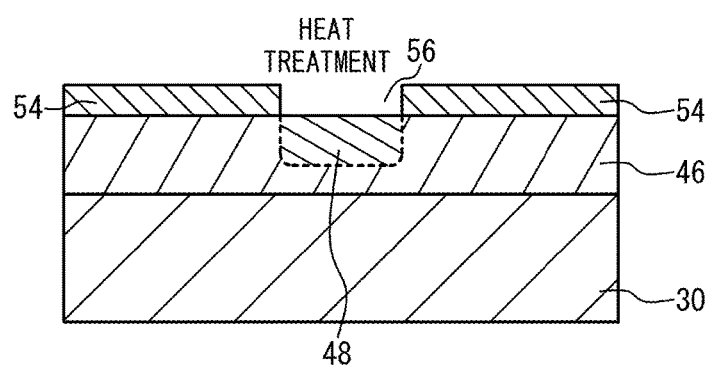

As illustrated in FIG. 15C, a cap 54 having an aperture 56 is formed on the germanium layer 30. The cap 54 is formed of, for example, a silicon oxide film. While the surface of the germanium layer 30 is exposed through the aperture 56, a heat treatment in a reducing gas atmosphere is performed. This process removes oxygen in the high oxygen concentration region 46 under the aperture 56, and forms the low oxygen concentration region 48. Oxygen in the high oxygen concentration region 46 covered with the cap 54 is not removed.

The reducing gas is only required to contain a gas such as hydrogen gas. The reducing gas may be, for example, a gas of 100% hydrogen gas, or a mixed gas of hydrogen gas and inert gas. The inert gas is, for example, a non-oxidizing gas, and is noble gas or nitrogen gas. The reducing gas may not necessarily contain hydrogen gas. For example, the reducing gas is only required to be a gas containing little oxygen, a gas that hardly reacts with the germanium layer 30 through a heat treatment, and a gas that removes oxygen in the germanium layer 30 through a heat treatment. For example, the reducing gas may be nitrogen gas containing little oxygen. As described above, the gas used in the heat treatment preferably contains little oxygen. The heat treatment temperature is preferably 700° C. or greater, more preferably 800° C. or greater as illustrated in FIG. 4 and FIG. 6A. The heat treatment time is preferably 1 minute or more, more preferably 5 minutes or more, further preferably 15 minutes or more.

Figure 15D:
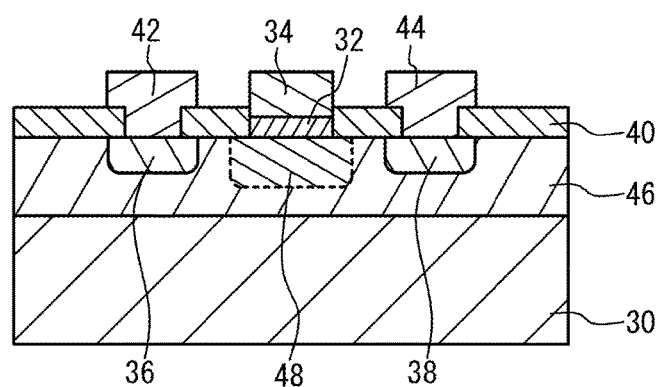

As illustrated in FIG. 15D, the source region 36 and the drain region 38 are formed in the high oxygen concentration region 46. The gate insulating film 32 and the gate electrode 34 are formed so that the channel region 50 (see FIG. 14) is included in the low oxygen concentration region 48. The insulating film 40 is formed on the high oxygen concentration region 46 in the germanium layer 30. The source electrode 42 is formed so as to make contact with the source region 36 through the aperture of the insulating film 40, and the drain electrode 44 is formed so as to make contact with the drain region 38 through the aperture of the insulating film 40. This process forms the FET similar to that of the first embodiment.

In the second embodiment, as illustrated in FIG. 15B and FIG. 15C, the oxygen concentration is set so that the oxygen concentration in a region to be the channel region 50 becomes less than the oxygen concentration in a region to be the junction interface 52 (see FIG. 14). This structure can also improve the FET characteristics as in the first embodiment.

Additionally, as illustrated in FIG. 15C, the germanium layer 30 is heat treated in a reducing atmosphere while the region to be the channel region 50 in the germanium layer 30 is exposed and the surface of the germanium layer 30 on the region to be the junction interface 52 (see FIG. 14) is not exposed. This process allows the low oxygen concentration region 48 to be easily formed.

As illustrated in FIG. 15B, before the heat treatment, oxygen may be introduced into the region to be the channel region 50 and the region to be the junction interface 52. This process allows the high oxygen concentration region 46 to be easily formed.

Third Embodiment

Figure 16A:
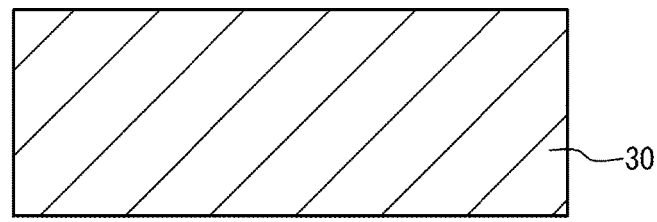
FIG. 16A through FIG. 16C are cross-sectional views illustrating a method for manufacturing an FET in accordance with a third embodiment.
Figure 16B:
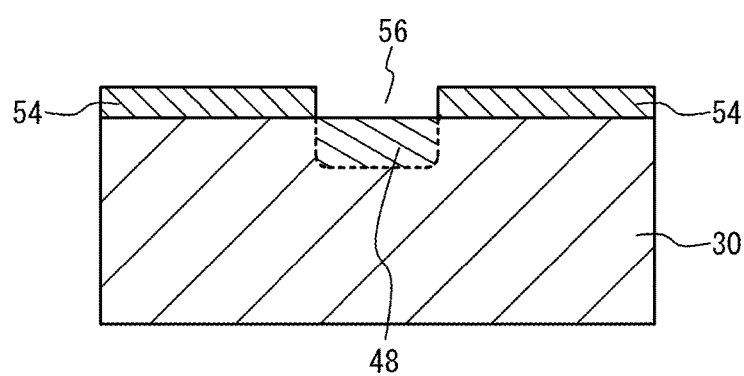
Figure 16C:
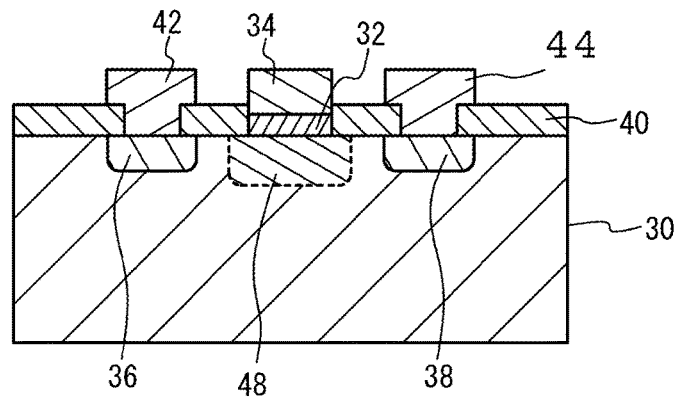

FIG. 16A through FIG. 16C are cross-sectional views illustrating a method for manufacturing an FET in accordance with a third embodiment. As illustrated in FIG. 16A, the germanium layer 30 is prepared. The germanium layer 30 has an oxygen concentration greater than $1\times10^{16}$ cm$^{-3}$ as, for example, the germanium layer 30 of the substrate B has. As illustrated in FIG. 16B, as in FIG. 15C of the second embodiment, oxygen in the region to be the channel region 50 is removed to form the low oxygen concentration region 48. As illustrated in FIG. 16C, the same process as that in FIG. 15D of the second embodiment is then performed. Other processes are the same as those of the second embodiment, and thus the description thereof is omitted.

As described in the third embodiment, the process of introducing oxygen can be omitted by using the germanium layer 30 having a high oxygen concentration such as the substrate B.

Fourth Embodiment

Figure 17A:
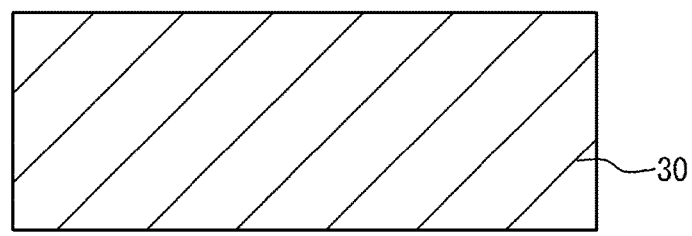
FIG. 17A through FIG. 17C are cross-sectional views illustrating a method for manufacturing an FET in accordance with a fourth embodiment.
Figure 17B:
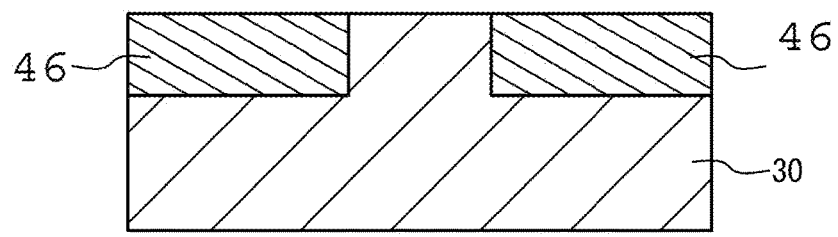
Figure 17C:
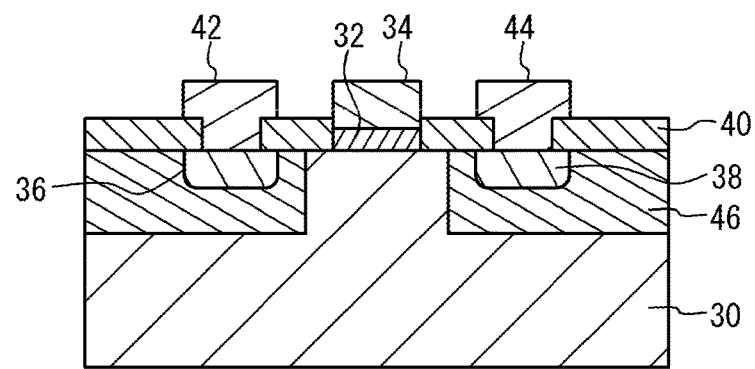

FIG. 17A through FIG. 17C are cross-sectional views illustrating a method for manufacturing an FET in accordance with a fourth embodiment. As illustrated in FIG. 17A, the germanium layer 30 is prepared. The germanium layer 30 has an oxygen concentration of $1\times10^{16}$ cm$^{-3}$ or less as, for example, the germanium layer 30 of the substrate A has. As illustrated in FIG. 17B, oxygen is not introduced into the region to be the channel region 50, and oxygen is introduced into the region(s) (46) to be the junction interface 52. As illustrated in FIG. 17C, the process same as that of FIG. 15D of the second embodiment is then performed. Other processes are the same as those of the first embodiment, and the description thereof is thus omitted.

In the fourth embodiment, oxygen is selectively introduced into the region(s) (46) to be the junction interface 52 while not being introduced into the region (e.g., 48) to be the channel region 50. This process allows a heat treatment in a reducing gas atmosphere illustrated in FIG. 15C of the second embodiment to be omitted.

Fifth Embodiment

Figure 18:
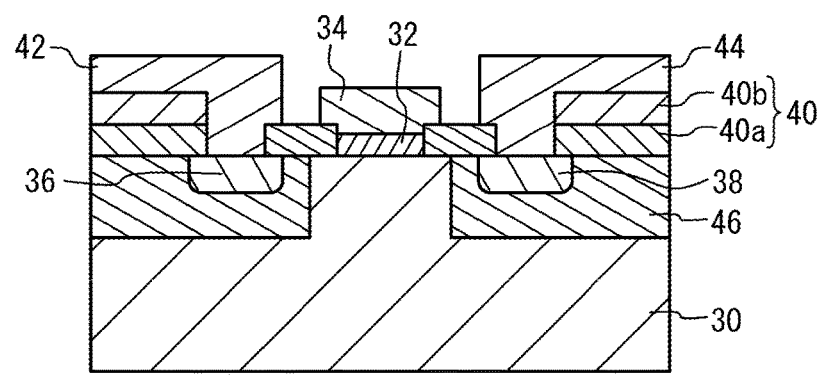
FIG. 18 is a cross-sectional view of a fabricated FET in accordance with a fifth embodiment.

A fifth embodiment fabricated an n-FET by using the method illustrated in FIG. 15A through FIG. 15D of the second embodiment. FIG. 18 is a cross-sectional view of a fabricated FET in accordance with the fifth embodiment. As the germanium layer 30, used was a p-type substrate A having the (100) plane as a principal plane and having an acceptor concentration of $2\times10^{16}$ cm$^{-3}$. Oxygen ions are implanted at an implantation energy of 100 keV and in a dose amount of $1\times10^{13}$ cm$^{-2}$. The cap for a heat treatment in a hydrogen gas atmosphere is a silicon oxide film. A hydrogen heat treatment is performed at a heat treatment temperature of 750° C. for a heat treatment time of 15 minutes. Ion implantation for forming the source region 36 and the drain region 38 is performed using phosphorus ions at an implantation energy of 50 keV and in a dose amount of $1\times10^{15}$ cm$^{-2}$. An activation annealing is performed in a nitrogen gas atmosphere, at a heat treatment temperature of 600° C. for a heat treatment time of 30 seconds.

As the gate insulating film 32, used was a germanium oxide film with an EOT of 4 nm. As the gate electrode 34, the source electrode 42, and the drain electrode 44, used was an aluminum film. As the insulating film 40, used were an yttrium oxide film 40a and a silicon oxide film 40b. A trial FET has a gate length L of 200 μm and a gate width W of 90 μm.

Figure 19:
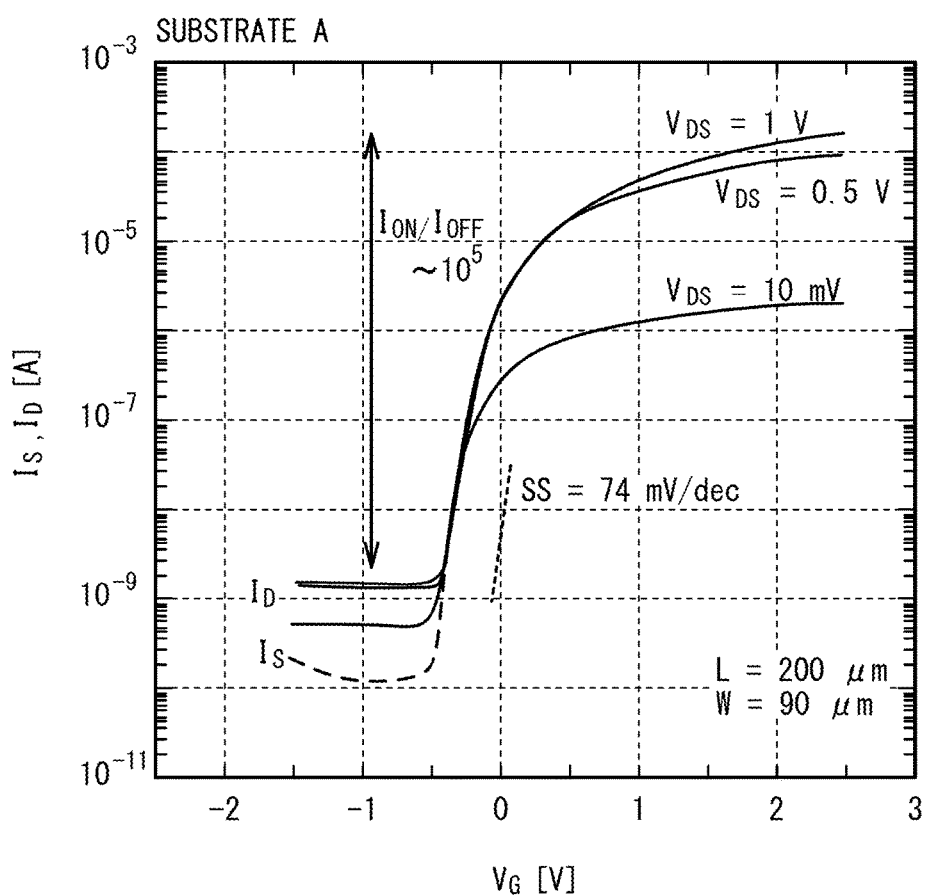
FIG. 19 is a graph of source current $I_S$ and drain current $I_D$ versus gate voltage $V_G$ in the fifth embodiment.

FIG. 19 is a graph of source current $I_S$ and drain current $I_D$ versus gate voltage $V_G$ in the fifth embodiment. As illustrated in FIG. 19, at room temperature, when the drain-source voltage $V_{DS}$ is 0.5 V and 1 V, the ratio of on-state current $I_{ON}$ to off-state current $I_{OFF}$ is approximately $10^5$. The sub-threshold coefficient SS is 74 mV/dec.

Figure 20:
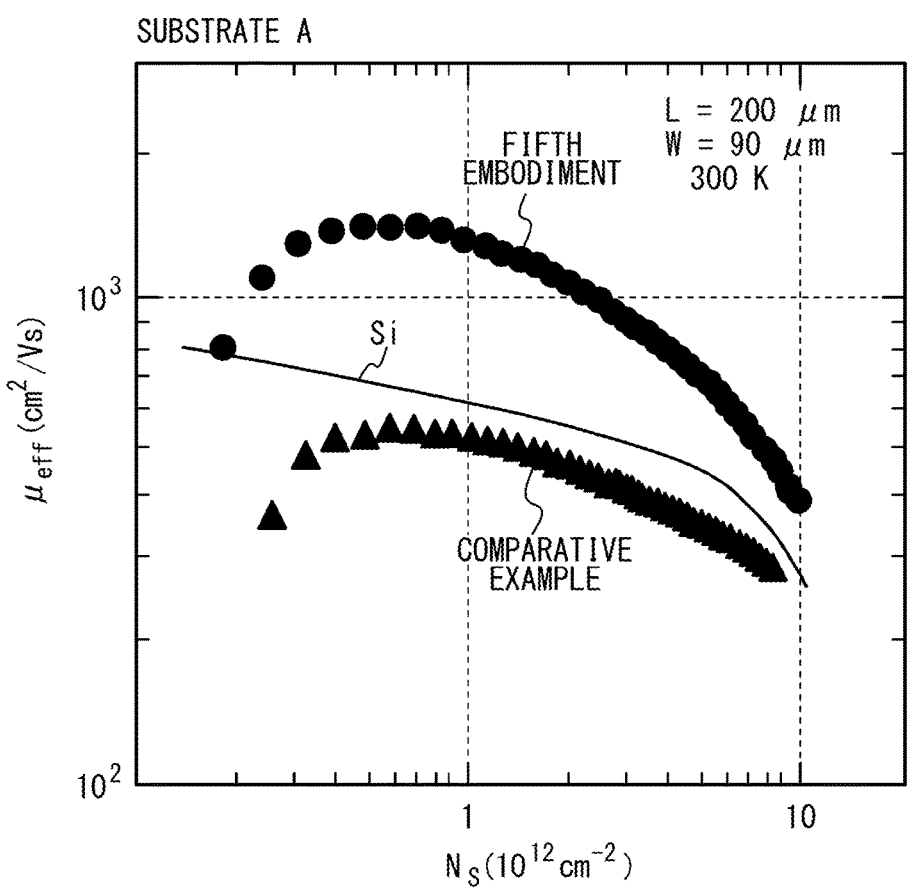
FIG. 20 is a graph of electron mobility $\mu_{eff}$ versus surface electron density $N_S$ in the fifth embodiment.

FIG. 20 is a graph of electron mobility $\mu_{eff}$ versus surface electron density $N_S$ in the fifth embodiment. A comparative example was fabricated by the same method as that of the fifth embodiment except that a heat treatment in a hydrogen gas atmosphere was not performed. The line Si indicates the typical mobility in a silicon MOSFET. As illustrated in FIG. 20, the mobility of the comparative example is less than that of the SiMOSFET. The mobility of the fifth embodiment is greater than that of the SiMOSFET till $N_S$ reaches $1\times10^{12}$ cm$^{-2}$, and beyond. The largest mobility is 1412 cm$^2$/Vs. The ON/OFF ratio of $10^5$, the sub-threshold coefficient of 74 mV/dec, and the electron mobility of 1412 cm$^2$/Vs are the highest values among those of germanium MOSFETs reported until now.

The first through fifth embodiments describe MOSFETs as examples, but may be applied to semiconductor devices other than the MOSFET.

The first through fifth embodiments have described an exemplary case where almost the entire channel region 50 is included in the low oxygen concentration region 48, and almost the entire pn junction interface 52 is included in the high oxygen concentration region 46, but a part of the channel region 50 may not be necessarily included in the low oxygen concentration region 48, and a part of the pn junction interface 52 may not be necessarily included in the high oxygen concentration region 46. For example, a part, which is located closer to the pn junction interface 52, of the channel region 50 may be included in the high oxygen concentration region 46. A part, which is located closer to the channel region 50, of the pn junction interface 52 may be included in the low oxygen concentration region 48. The region, which contributes to the increase in on-state current, of the channel region 50 is preferably included in the low oxygen concentration region 48. The region, which contributes to the reduction of the off-state current, of the pn junction interface 52 is preferably included in the high oxygen concentration region 46.

As the structure of the FET, a simple structure in which the source region 36 and the drain region 38 are formed in the germanium layer 30 has been described as an example, but the FET may have other structures. For example, a Lightly Doped Drain (LDD) structure or a Fin-FET structure may be employed. Alternatively, a Germanium On Insulator (GOI) structure may be employed.

When an FET is manufactured in accordance with the manufacturing method of the third embodiment, it is difficult to detect the oxygen concentration in the channel region near the surface of the germanium substrate. However, it is considered that the oxygen concentration is approximately equal to the oxygen concentration at the depth of approximately 1 µm under the gate insulating film 32. Additionally, as illustrated in FIG. 4, in the germanium layer under the gate insulating film 32, the oxygen concentration at 1 µm from the surface becomes less than the oxygen concentration at 5 µm from the surface, and becomes less than $1\times10^{16}$ cm$^{-3}$.

Although preferred embodiments of the present invention have been described so far, the present invention is not limited to those particular embodiments, and various changes and modifications may be made to them within the scope of the invention claimed herein.

DESCRIPTION OF REFERENCE NUMERALS 10 germanium substrate
12 germanium oxide film
14 gate electrode
16 source region
18 drain region
20 oxygen-ion-implanted region
22 n-type region
24 insulating film
26 source electrode
28 drain electrode
30 germanium layer
32 gate insulating film
34 gate electrode
36 source region
38 drain region
40 insulating film
42 source electrode
44 drain electrode
46 high oxygen concentration region
48 low oxygen concentration region
50 channel region
52 junction interface
54 cap
56 aperture

The invention claimed is:

1. A semiconductor device, comprising:
a channel region that is formed in a germanium layer and has a first conductive type; and
a source region and a drain region that are formed in the germanium layer and have a second conductive type different from the first conductive type, wherein
an oxygen concentration in the channel region is less than an oxygen concentration in a p-n junction interface between at least one of the source region and the drain region and a corresponding at least one region that surrounds the at least one of the source region and the drain region, the corresponding at least one region having the first conductive type.

2. The semiconductor device according to claim 1, wherein
the oxygen concentration in the channel region is $1\times10^{16}$ cm$^{-3}$ or less, and
the oxygen concentration in the p-n junction interface is greater than $1\times10^{16}$ cm$^{-3}$.

3. The semiconductor device according to claim 2, wherein
the oxygen concentration in the channel region is $5\times10^{15}$ cm$^{-3}$ or less.

4. The semiconductor device according to claim 1, wherein
the first conductive type is p-type, and
the second conductive type is n-type.

5. A method for manufacturing a semiconductor device, comprising:
forming a channel region that is formed in a germanium layer and has a first conductive type;
forming a source region and a drain region in the germanium layer, the source region and the drain region having a second conductive type different from the first conductive type; and
setting an oxygen concentration so that an oxygen concentration in the channel region is less than an oxygen concentration in a p-n junction interface between at least one of the source region and the drain region and a corresponding at least one region that surrounds the at least one of the source region and the drain region, the corresponding at least one region having the first conductive type.

6. The method for manufacturing a semiconductor device according to claim 5, wherein
the setting of the oxygen concentration includes heat treating the germanium layer in a reducing atmosphere while a region to be the channel region in the germanium layer is exposed and a surface of the germanium layer on a region to be the p-n junction interface is not exposed.

7. The method for manufacturing a semiconductor device according to claim 6, wherein
the heat treating includes heat treating a germanium layer of which oxygen concentrations in the channel region and the p-n junction interface are $1\times10^{16}$ cm$^{-3}$ or greater.

8. The method for manufacturing a semiconductor device according to claim 6, further comprising introducing oxygen into the region to be the channel region and the region to be the junction interface before the heat treating.

9. The method for manufacturing a semiconductor device according to claim 5, wherein
the setting of the oxygen concentration includes selectively introducing oxygen into a region to be the p-n junction interface while not introducing oxygen into a region to be the channel region.

10. The method for manufacturing a semiconductor device according to claim 5, wherein
the setting of the oxygen concentration includes setting the oxygen concentration so that the oxygen concentration in the channel region becomes $1\times10^{16}$ cm$^{-3}$ or less and the oxygen concentration in the p-n junction interface becomes greater than $1\times10^{16}$ cm$^{-3}$.

11. The semiconductor device according to claim 1, wherein
the at least one of the source region and the drain region is in contact with the corresponding at least one region at the p-n junction interface.

12. The method for manufacturing a semiconductor device according to claim 5, wherein
the at least one of the source region and the drain region is in contact with the corresponding at least one region at the p-n junction interface.

\* \* \* \* \*